(12) United States Patent
Zhang et al.

(10) Patent No.: US 11,985,780 B2
(45) Date of Patent: May 14, 2024

(54) ELECTRONIC DEVICE, EXPANSION CARD ASSEMBLY, SERVER DEVICE AND MANAGEMENT METHOD THEREFOR

(71) Applicant: Hangzhou Hikvision Digital Technology Co., Ltd., Hangzhou (CN)

(72) Inventors: Honghai Zhang, Hangzhou (CN); Yanfei Zhang, Hangzhou (CN); Jie Yan, Hangzhou (CN); Chuan Chen, Hangzhou (CN); Rui Chen, Hangzhou (CN)

(73) Assignee: HANGZHOU HIKVISION DIGITAL TECHNOLOGY CO., LTD., Hangzhou (CN)

( * ) Notice: Subject to any disclaimer, the term of this patent is extended or adjusted under 35 U.S.C. 154(b) by 543 days.

(21) Appl. No.: 17/262,377

(22) PCT Filed: Jul. 25, 2019

(86) PCT No.: PCT/CN2019/097633
§ 371 (c)(1),
(2) Date: Jan. 22, 2021

(87) PCT Pub. No.: WO2020/020274
PCT Pub. Date: Jan. 30, 2020

(65) Prior Publication Data
US 2021/0315115 A1 Oct. 7, 2021

(30) Foreign Application Priority Data

Jul. 27, 2018 (CN) .................. 201810844568.X
Nov. 22, 2018 (CN) .................. 201821932882.5

(51) Int. Cl.
*G06F 1/16* (2006.01)
*H05K 5/00* (2006.01)
(Continued)

(52) U.S. Cl.
CPC ............ *H05K 5/0286* (2013.01); *H05K 7/10* (2013.01); *H05K 7/1418* (2013.01);
(Continued)

(58) Field of Classification Search
CPC ...... H05K 5/0286; H05K 5/282; H05K 5/256; H05K 7/1418; H05K 7/1435
See application file for complete search history.

(56) References Cited

U.S. PATENT DOCUMENTS 10,477,707 B1 * 11/2019 Petersen .............. H05K 5/0069
10,729,030 B1 * 7/2020 Cousineau ............ G06F 13/409
(Continued)

FOREIGN PATENT DOCUMENTS

CN 105045744 11/2015
CN 105893307 8/2016
(Continued)

OTHER PUBLICATIONS

International Search Report and Written Opinion issued in Corresponding PCT Application No. PCT/CN2019/097633, dated Oct. 29, 2019 (English Translation provided).

*Primary Examiner* — Anthony M Haughton
(74) *Attorney, Agent, or Firm* — NORTON ROSE FULBRIGHT US LLP

(57) ABSTRACT

Disclosed are an electronic device, an expansion card assembly and a server device. The electronic device comprises a hard disk slot and the expansion card assembly. The expansion card assembly is arranged in the hard disk slot in a pluggable manner; the hard disk slot comprises a first type of interface and a second type of interface. The first type of interface is used for communicating with the hard disk, and the second type of interface is used for communicating with the expansion card assembly. Therefore, the expansion card assembly is expanded by means of the hard disk slot in the
(Continued)

electronic device, so that the expansion requirement of the expansion card assembly is met.

19 Claims, 13 Drawing Sheets

(51) Int. Cl.
    *H05K 5/02*     (2006.01)
    *H05K 7/00*     (2006.01)
    *H05K 7/10*     (2006.01)
    *H05K 7/14*     (2006.01)
    *H05K 7/20*     (2006.01)

(52) U.S. Cl.
    CPC ....... *H05K 7/1435* (2013.01); *H05K 7/20172* (2013.01); *H05K 7/20209* (2013.01); *H05K 7/20409* (2013.01)

(56) References Cited

U.S. PATENT DOCUMENTS

| | | | |
|---|---|---|---|
| 2004/0100775 A1* | 5/2004 | Baker | G11B 33/128 |
| 2006/0292918 A1* | 12/2006 | Behl | G06F 1/187 |
| 2008/0168204 A1* | 7/2008 | Sultenfuss | H05K 7/1429 710/301 |
| 2017/0017600 A1* | 1/2017 | Breakstone | G06F 1/185 |
| 2018/0027063 A1* | 1/2018 | Nachimuthu | G06F 1/183 709/226 |
| 2019/0286197 A1* | 9/2019 | Khan | G06F 1/20 |

FOREIGN PATENT DOCUMENTS

| | | |
|---|---|---|
| CN | 106503369 | 3/2017 |
| CN | 108509361 | 9/2018 |
| CN | 209015216 | 6/2019 |
| WO | WO 2016/085016 | 6/2016 |

* cited by examiner

ELECTRONIC DEVICE, EXPANSION CARD ASSEMBLY, SERVER DEVICE AND MANAGEMENT METHOD THEREFOR

CROSS REFERENCE TO RELATED APPLICATIONS

The present application is a national phase application under 35 U.S.C. § 371 of International Application No. PCT/CN2019/097633, filed Jul. 25, 2019, which claims the benefit of priority to Chinese patent application No. 201810844568.X, filed with the China National Intellectual Property Administration on Jul. 27, 2018, and entitled "Image processing apparatus, server device, and server device management method", and the Chinese patent application No. 201821932882.5, filed with the China National Intellectual Property Administration on Nov. 22, 2018, and entitled "Electronic device", the entire contents of each of which are incorporated herein by reference in their entirety.

TECHNICAL FIELD

The application relates to the field of computer device, and in particular, to an electronic device, an expansion card assembly, a server device, and a management method therefor.

BACKGROUND

Electronic devices, such as servers and hosts, can be extended, through PCI-Express (PCIE, a high-speed serial computer expansion bus standard) slots, with expansion card assemblies such as Graphics Processing Unit (GPU) assemblies and Central Processing Unit/Processor (CPU) assemblies. However, electronic devices may not be equipped with enough PCIE slots to fulfill the expansion need of expansion card assemblies.

SUMMARY

The application provides an electronic device, an expansion card assembly, a server device and a management method thereof, so as to meet the expansion requirement of the expansion card assembly.

To achieve the above object, in a first aspect, an embodiment of the present application provides an electronic device, comprising: a hard disk slot and an expansion card assembly; wherein the expansion card assembly is arranged in the hard disk slot in a pluggable manner; the hard disk slot comprises a first type of interface for communicating with a hard disk and a second type of interface for communicating with the expansion card assembly.

Optionally, the expansion card assembly comprises a processing circuit, a control circuit, and a communication interface; wherein the processing circuit and the communication interface are respectively connected with the control circuit, and the communication interface is connected with the second type of interface.

Optionally, the device further comprises a power supply assembly; the expansion card assembly further comprises an expansion card power supply interface, and the hard disk slot further comprises a slot power supply interface; wherein, the power supply assembly is connected with the slot power supply interface, the slot power supply interface is connected with the expansion card power supply interface, and the expansion card power supply interface supplies power for the processing circuit and the control circuit.

Optionally, the device further comprises a network expansion assembly that communicates with the communication interface of the expansion card assembly via the second type of interface.

Optionally, the expansion card assembly further comprises a cooling device.

Optionally, the device further comprises an indicator; and the expansion card assembly further comprises a light guide that guides light emitted by the indicator.

Optionally, wherein the expansion card assembly is arranged in the hard disk slot in a pluggable manner via a tray of the hard disk slot; and the expansion card assembly further comprises a fixing hump through which the tray of the hard disk slot is fixed.

Optionally, the second type of interface is a PCIE interface, and the first type of interface is a SAS interface or a SATA interface.

Optionally, the hard disk slot comprises an SFF8639 interface.

Optionally, the hard disk slot is arranged outside a back board, a main board, or a case.

Optionally, the expansion card assembly comprises one or more of: a GPU assembly, a CPU assembly, a processor assembly, a network card assembly, a wireless communication assembly and an input/output assembly.

Optionally, the GPU assembly comprises a GPU chip, a control chip, a control interface, and a communication interface; wherein the GPU chip, the control interface and the communication interface are respectively connected with the control chip, and the communication interface is connected with the second type of interface.

Optionally, the device further comprises a power supply assembly; the GPU assembly further comprises a GPU power supply interface, and the hard disk slot further comprises a slot power supply interface; wherein, the power supply assembly is connected with the slot power supply interface, the slot power supply interface is connected with the GPU power supply interface, and the GPU power supply interface supplies power for the GPU chip and the control chip.

Optionally, the device further comprises a network expansion assembly that communicates with the communication interface of the GPU assembly via the second type of interface.

Optionally, the GPU assembly further comprises:
a cooling fan; and/or a cooling fin connected to the GPU chip.

Optionally, the device further comprises an indicator; and the GPU assembly comprises a light guide that guides light emitted by the indicator.

Optionally, the GPU assembly is arranged in the hard disk slot in a pluggable manner via a tray of the hard disk slot; and the GPU assembly comprises a fixing hump by which the tray of the hard disk slot is fixed.

To achieve the object, in a second aspect, an embodiment of the present application further provides an electronic device, comprising: a hard disk slot that supports a pluggable expansion card assembly and comprises a first type of interface for communicating with a hard disk and a second type of interface for communicating with the expansion card assembly.

Optionally, the device further comprises a power supply assembly; and the hard disk slot further comprises a slot power supply interface; wherein the power supply assembly is connected with the slot power supply interface, and the slot power supply interface is used for supplying power for the expansion card assembly.

Optionally, the device further comprises a network expansion assembly for communicating with a communication interface of the expansion card assembly via the second type of interface.

Optionally, the second type of interface is a PCIE interface, and the first type of interface is a SAS interface or a SATA interface.

Optionally the hard disk slot comprises an SFF8639 interface.

Optionally, the hard disk slot is arranged outside a back board, a main board, or a case.

Optionally, the expansion card assembly comprises one or more of: a GPU assembly, a CPU assembly, a processor assembly, a network card assembly, a wireless communication assembly and an input/output assembly.

In a third aspect, an embodiment of the present application provides an expansion card assembly, comprising: a service module and a first high-speed interface;
- the service module is connected with the first high-speed interface;
- the first high-speed interface comprises: a serial attached interface (SAS) or a serial advanced technology attachment (SATA) interface or a high-speed serial computer expansion bus PCIE interface;
- the first high-speed interface is used for transmitting network signals, the network signals comprising reduced gigabit media independent interface (RGMII) signals and gigabit media independent interface (GMII) signals.

Optionally, the service module comprises at least one of: an image processor, a CPU assembly, a processor assembly, a network card assembly, a wireless communication assembly and an input/output assembly.

Optionally, the service module comprises an image processor, which comprises an image processing chip and a control chip;
- the control chip is connected with the image processing chip and the first high-speed interface; and
- the control chip converts the network signals into data information that can be recognized by the image processing chip.

Optionally, the first high-speed interface is an U.2 interface.

In a fourth aspect, an embodiment of the present application provides a server device, wherein the server device comprises a main board having a second high-speed interface arranged thereon which comprises: a SAS interface, a SATA interface or a PCIE interface; the main board is connected, via the second high-speed interface, with a first high-speed interface of an expansion card assembly according to the third aspect.

Optionally, the second high-speed interface is an U.2 interface.

Optionally, the server device further comprises a back board, on which the second high-speed interface is arranged;
- the back board is connected with the expansion card assembly via the second high-speed interface;
- the main board has an expansion interface arranged thereon, and is connected with the back board via the expansion interface, and the expansion interface comprises: a SAS interface or a SATA interface.

Optionally, the server device further comprises a network expansion assembly that comprises a network switch module and a network routing module;
- the network switch module is connected with the network routing module; and
- the network switch module is connected with the back board and the main board.

Optionally, the server device further comprises a power supply assembly connected with the network expansion assembly, the main board and the back board.

In a fifth aspect, an embodiment of the present application provides a method for managing an expansion card assembly, applicable to a server device according to the fourth aspect. The server device is connected with a plurality of expansion card assemblies via a second high-speed interface. The method comprises:
- obtaining operating states of the expansion card assemblies in a preset cycle, wherein an operating state comprises a workload;
- determining whether the workload of each of the expansion card assemblies is greater than a first preset warning value; and
- if the workload of each expansion card assembly is greater than the first preset warning value, sending a temperature warning message; or if the workload of each expansion card assembly is not greater than the first preset warning value, assigning a new processing task to an expansion card assembly with the minimum workload.

Optionally, the operating state comprises: an operating temperature;
- after obtaining operating states of the expansion card assemblies in a preset cycle, the method further comprises:
- determining whether an operating temperature of any of the expansion card assemblies is higher than a second preset warning value;
- if any of the expansion card assemblies has an operating temperature higher than the second preset warning value, increasing the rotation rate of a cooling fan; and
- if the rotation rate is at a maximum rate and an expansion card assembly has an operating temperature higher than the second preset warning value, sending a temperature warning message.

Optionally, the method further comprises:
- powering on the expansion card assemblies one after another when the server device is started.

Optionally, the method further comprises:
- if the operating state of an expansion card assembly cannot be obtained, restarting the expansion card assembly.

The electronic device according to the embodiments of the present application comprises a hard disk slot and an expansion card assembly; wherein the expansion card assembly is arranged in the hard disk slot in a pluggable manner; the hard disk slot comprises a first type of interface and a second type of interface, the first type of interface is used for communicating with the hard disk, and the second type of interface is used for communicating with the expansion card assembly. It can be seen that the expansion card assembly is expanded by means of the hard disk slot in the electronic device, so that an expansion requirement of the expansion card assembly is met. In the expansion card assembly, the server device, and the method for managing the server device according to the embodiments of the present application, the expansion card assembly comprises: a service module and a first high-speed interface; the service module is connected with the first high-speed interface. The first high-speed interface is a SAS interface, a SATA interface, or a PCIE interface capable of transmitting a network signal, so that the expansion card assembly according to the embodiment of the present application can be connected to a hard disk interface of a device such as a server via the first high-speed interface, for example, a SAS interface, a SATA interface, or a U.2 interface on a main board of the server. Data or information in the form of network signals may be obtained via the first high-speed interface and then the data or information may be processed correspondingly through the service module. Not only through PCIE interfaces expansion card assemblies are connected, but also through the first high-speed interface, more expansion card assemblies may be connected to a device such as a server and the like, and the number of the expansion card assemblies that can be connected to the device such as the server and the like is expanded. Of course, it is not necessary for any product or method implementing the present invention to achieve all of the advantages described above at the same time for practicing the invention.

BRIEF DESCRIPTION OF THE DRAWINGS

In order to illustrate the embodiments of the present application and the technical solutions of the prior art more clearly, the drawings used in the embodiments and the prior art are briefly described below, obviously, the drawings in the following description are merely some embodiments of the present application, and for those of ordinary skill in the art, other drawings may be obtained from these drawings without creative work.

DETAILED DESCRIPTION

In order to make the purpose, technical solutions, and advantages of the present application clearer, the following further describes the present application in detail with reference to the accompanying drawings and embodiments. Obviously, the embodiments described are only a part of the embodiments of the present application, and not all the embodiments. Based on the embodiments in this application, all other embodiments obtained by those of ordinary skill in the art without creative work shall fall within the protection scope of this application.

In order to solve the above technical problem, embodiments of the present application provide two types of electronic devices, which may be a server, a host or other devices. Embodiments are not limited in this aspect. A first electronic device will be described in detail below.

Figure 1:
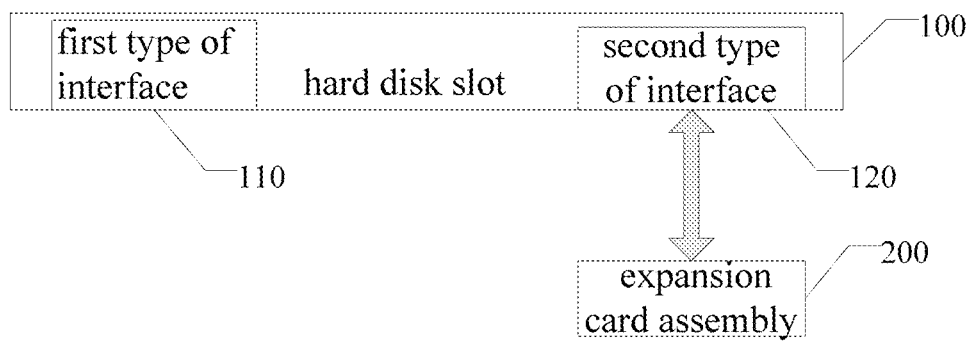
FIG. 1 is a first structural schematic diagram of an electronic device according to an embodiment of the present application.

FIG. 1 is a first structural schematic diagram of an electronic device according to an embodiment of the present application, including: a hard disk slot 100 and an expansion card assembly 200.

The expansion card assembly 200 is arranged in the hard disk slot 100 in a pluggable manner. The hard disk slot 100 includes a first type of interface 110 for communicating with a hard disk and a second type of interface 120 for communicating with the expansion card assembly 200.

In a case, the first type of interfaces and the second type of interfaces may be completely different interfaces, that is to say, some interfaces in the hard disk slot may only communicate with the hard disk, and some interfaces may only communicate with the expansion card assembly. Alternatively, the first type of interfaces and the second type of interfaces may be partially same. For example, some interfaces in the hard disk slot can communicate with both the hard disk or the expansion card assembly.

In one implementation, the expansion card assembly 200 may include one or more of the following: a GPU assembly, a CPU assembly, a processor assembly, an network card assembly, a wireless communication assembly and an input/output assembly.

In non-limiting examples, the GPU assembly may include a GPU chip, and the CPU assembly may include a single chip, an ARM processor, or an X86 processor; the processor assembly may include an Accelerated Processing Unit (APU), or a Tensor Processing Unit (TPU); the network card assembly may include a 10M network card, a 100M network card, a 1000M network card, a 10G network card, a 25G network card, a 40G network card, a 100G network card, or a wifi (wireless fidelity) assembly; the wireless communication assembly may include an IoT (Internet of things) wireless assembly, such as an IoT-NODE433 assembly, a Bluetooth assembly, a zigbee assembly, a wifi assembly; and the input/output assembly may include various IoT input/output interface boards, such as an alarm IO, an RS232 interface board, an RS485 interface board, and a USB interface board.

If the expansion card assembly 200 is a GPU assembly, the analysis capability of the electronic device can be expanded in embodiments of the present application. If the expansion card assembly 200 is a CPU assembly or a processor assembly, the computing capability of the electronic device can be expanded in embodiments of the present application. If the expansion card assembly 200 is a network card assembly or a wireless communication assembly, the communication capability of the electronic device can be expanded in the embodiment of the application. It can be seen that in the solution, the expansion requirement of the expansion card assemblies can be met using hard disk slots, and the device's capabilities in analysis, computation and communication are expanded.

The hard disk slot 100 may be arranged outside the back board, the main board, or the case. Embodiments are not limited in positions of slots. The numbers of hard disk slots and expansion card assemblies are not limited and may be configured as desired.

By way of example instead of limitation, the hard disk slot may include an SFF8639 interface, for example, a U.2 interface in the SFF8639, or a U.3 interface in the SFF8639. In the embodiment of the present application, the hard disk slot includes a first type of interface and a second type of interface. In a case, the second type of interface may be a PCIE Interface, and the first type of interface may be a Serial Attached SCSI; SCSI: Small Computer System Interface (SAS) interface or a Serial Advanced Technology Attachment (SATA) interface. The PCIE interface may transmit an ethernet Reduced Gigabit Media Independent Interface (RGMII) signal or a Gigabit Media Independent Interface (GMII) signal.

For example, referring to FIG. 2 showing U.2 interfaces in SFF8639, wherein SAS (SAS-1 and SAS-2) interfaces/SATA interface serve as interfaces of the first type to communicate with a hard disk, and PCIE interfaces (PCIE channels 0 to 3) serve as interfaces of the second type to communicate with the expansion card assembly. It can be seen that, in the solution, the SATA interface and the SAS interfaces of the original hard disk slot may be reused, and there is no need to redefine the first type of interfaces. This may save manpower.

Figure 2A:
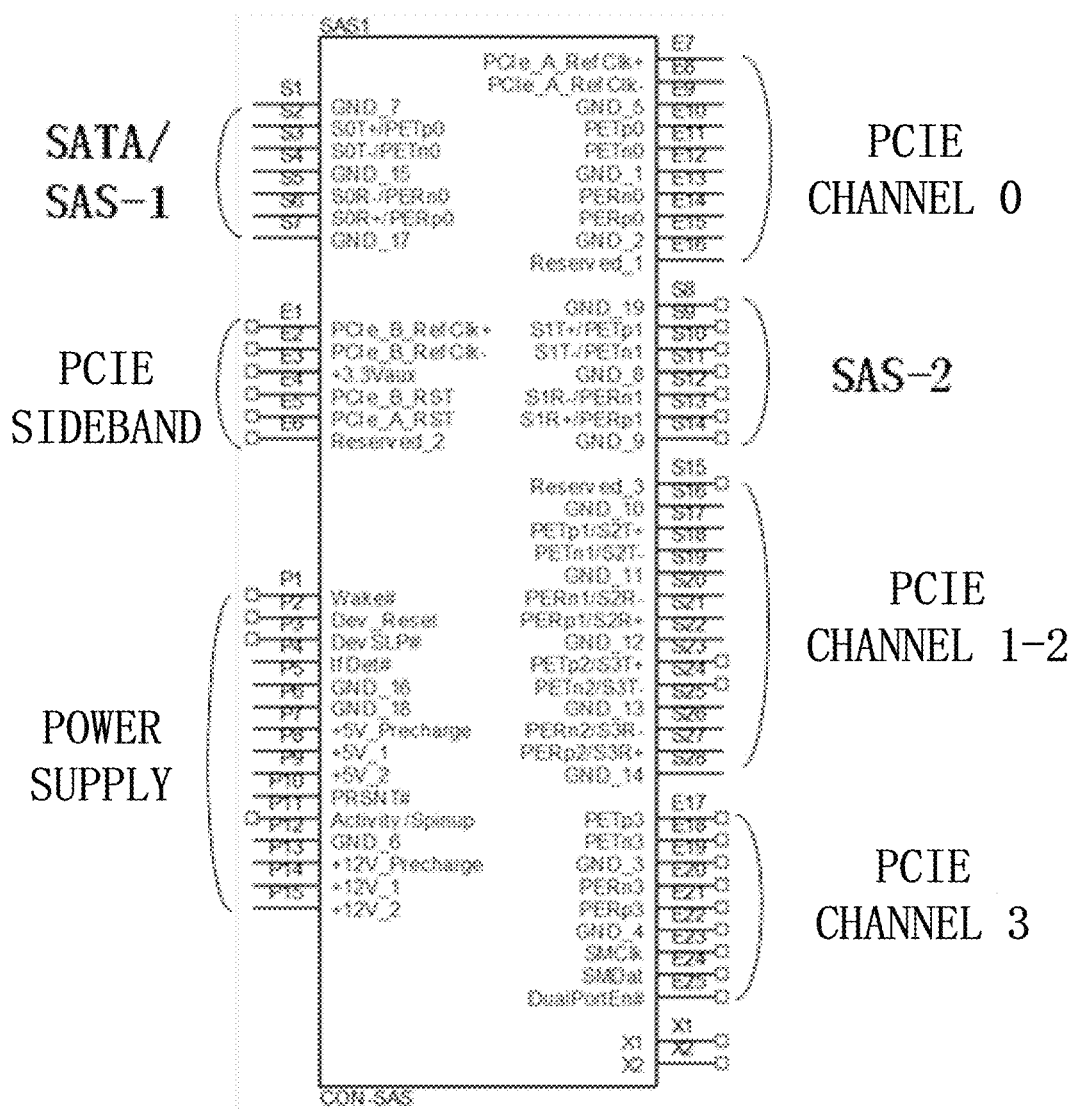
FIG. 2a is a structural schematic diagram of interfaces of an SFF8639 according to an embodiment of the present application.

The SFF8639 interfaces in FIG. 2a may also include a sideband of PCIE interfaces configured for modulating signals transmitted by the PCIE interfaces.

Figure 3:
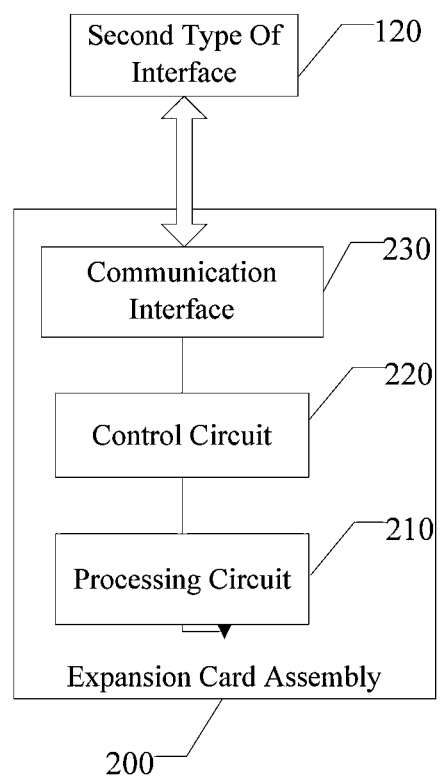
FIG. 3 is a first structural schematic diagram of an expansion card assembly according to an embodiment of the present application.

In one implementation, referring to FIG. 3, the expansion card assembly 200 may include a processing circuit 210, a control circuit 220, and a communication interface 230. The processing circuit 210 and the communication interface 230 are respectively connected to the control circuit 220, and the communication interface 230 is connected to the second type of interface 120.

It may be understood that the processing circuit 210 is a core circuit of the expansion card assembly. For example, if the expansion card assembly is a GPU assembly, the processing circuit is a GPU chip; if the expansion card assembly is a processor assembly, the processing circuit is a processor chip, such as an APU chip or a TPU chip. The control circuit 220 may be an out-of-band control circuit for controlling soft reset and hard reset of the processing circuit 210. The control circuit 220 may further monitor the temperature of the expansion card assembly 200, and control a cooling device to dissipate heat when the temperature is high.

In the embodiment, the control circuit may include a communication circuit connected to the communication interface. Alternatively, a communication circuit may be separate from the control circuit. Alternatively, the control circuit and the processing circuit may be integrated in the same chip. Each part of the device in the electronic device may be arranged separately or integrally according to actual conditions. Embodiments are not limited in this aspect. The expansion card assembly 200 may further include other components, such as a control interface, a power supply interface, or a power supply circuit. Embodiments are not limited.

Figure 2B:
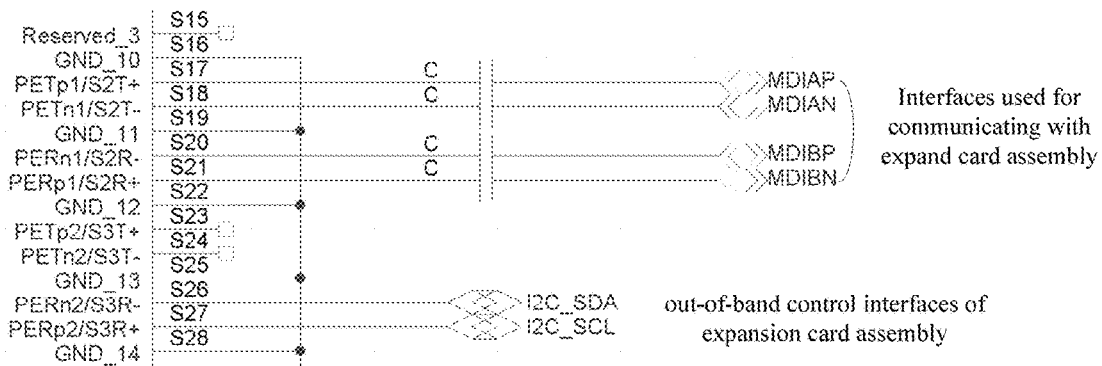
FIG. 2b is a structural schematic diagram of a part of interfaces of an improved SFF8639 according to an embodiment of the present application.

Continuing with the example of FIG. 2b showing part of the interfaces in FIG. 2a, wherein the hard disk slot includes the SFF8639 interfaces. S26 and S27 in the SFF8639 interface may be redefined as out-of-band control interfaces of the expansion card assembly. The redefined interfaces of S26 and S27 also belong to the second type of interfaces 120. The control circuit 220 of the expansion card assembly 200 may be controlled through the redefined interfaces of S26 and S27 to perform operations such as soft reset and hard reset on the expansion card assembly 200.

Specifically, in FIG. 2b, S26 and S27 are connected to a low-speed bus I2C_SCL (clock synchronization line of I2C) and I2C_SDA (data line of I2C) respectively and transmit signaling to the control circuit 220 through the low-speed bus.

Still continuing with the example in FIG. 2b, wherein the hard disk slot includes the SFF8639 interface, S17, S18, S20, and S21 in the SFF8639 interface may be redefined as interfaces for communicating with the expansion card assembly. The redefined interfaces S17, S18, S20, and S21 also belong to the second type of interfaces 120, and the communication interface 230 of the expansion card assembly 200 may communicate with the redefined interfaces of S17, S18, S20, and S21.

Specifically, in FIG. 2b, C represents a capacitor, and Medium Dependent Interface (MDI) signals are divided into two groups A and B of differential signals. MDIAP represents a positive pole of group A of MDI signals, and MDIAN represents a negative pole of group A of MDI signals, MDIBP represents a positive pole of group B of MDI signals, and MDIBN represents a negative pole of group B of MDI signals.

Figure 2C:
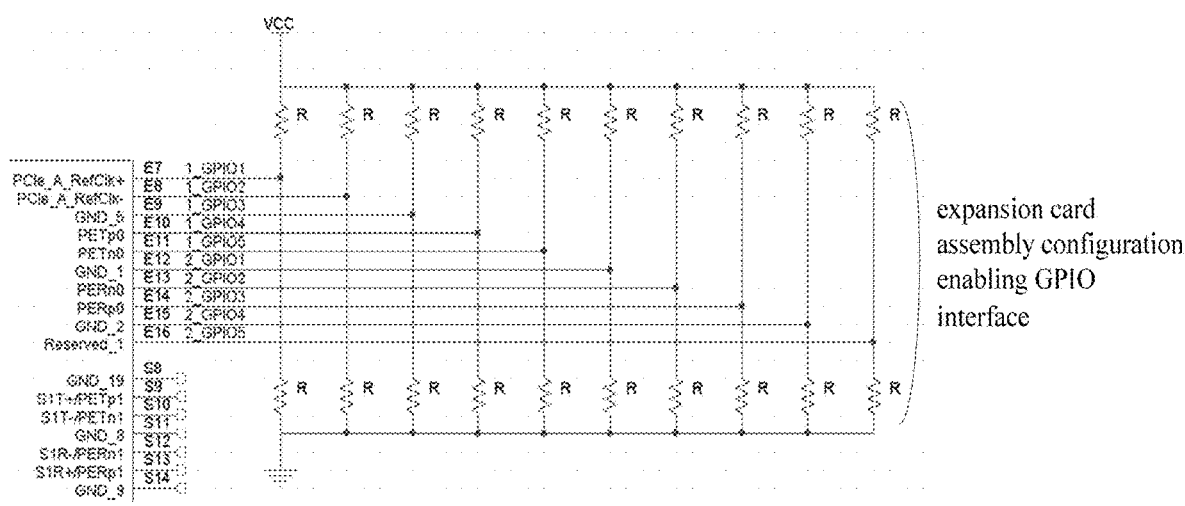
FIG. 2c is a structural schematic diagram of a part of interfaces of the improved SFF8639 according to an embodiment of the present application.

Referring to FIG. 2c showing a part of the interfaces in FIG. 2a, E7 to E16 in an SFF8639 interface may be redefined as bit configuration General Purpose Input/Output (GPIO) pins for IP/MAC address of the expansion card assembly 200, that is, the expansion card assembly configuration enabling GPIO interface. In FIG. 2c, R represents a resistor. By pulling up and pulling down the 10 GPIOs E7-E16 to different states, IP/MAC addresses of the processing circuits in the expansion card assembly may be independently addressed, such that address conflict is reduced. For example, the range of the states of 10 GPIOs may be hexadecimal 0x000 to 0x3ff.

If the expansion card assembly is a GPU assembly, and it is assumed that the GPU assembly includes a plurality of GPU chips, and the plurality of GPU chips are connected to these GPIOs respectively, so that the IP/MAC addresses of the GPUs can be independently addressed, and address conflict is reduced.

Figure 4:
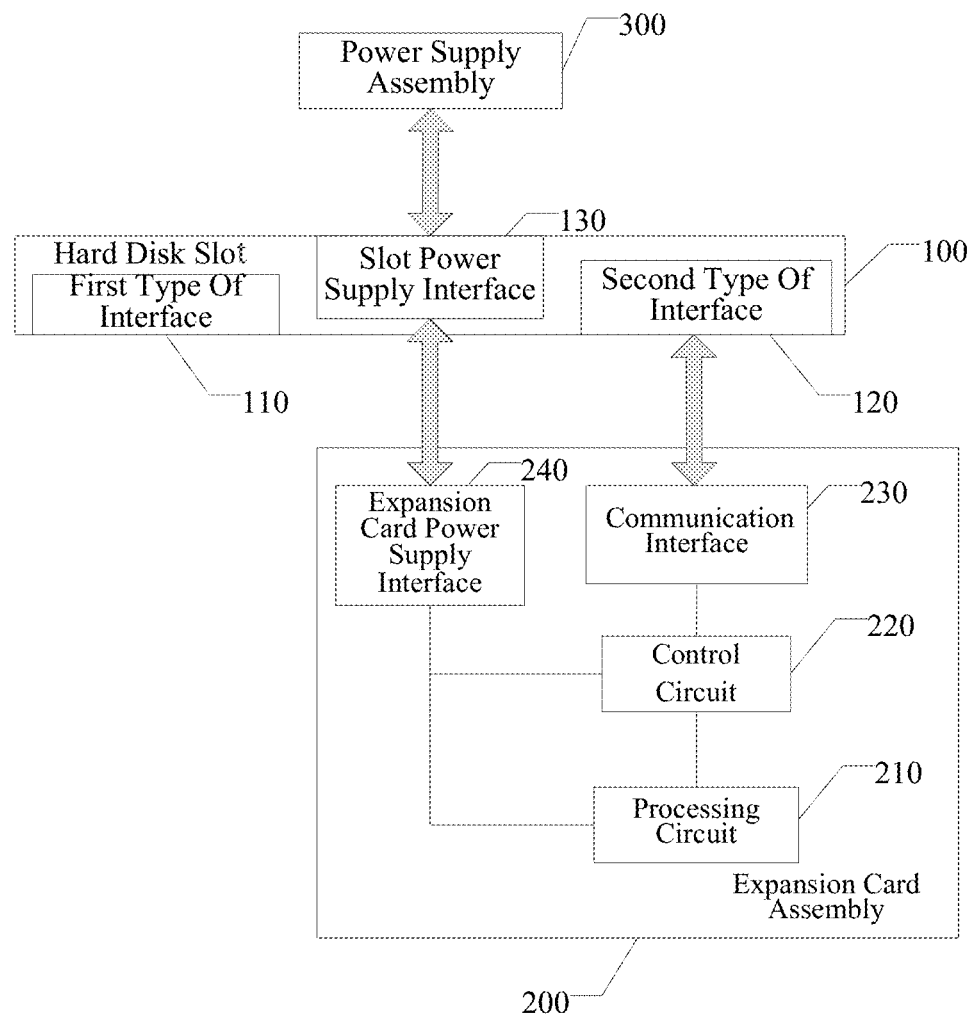
FIG. 4 is a second structural schematic diagram of an electronic device according to an embodiment of the present application.

As an embodiment, the device may further include a power supply assembly 300. Referring to FIG. 4, the expansion card assembly 200 further includes an expansion card power supply interface 240, and the hard disk slot 100 further includes a slot power supply interface 130. The power supply assembly 300 is connected with the slot power supply interface 130, the slot power supply interface 130 is connected with the expansion card power supply interface 240, and the expansion card power supply interface 240 supplies power for the processing circuit 210 and the control circuit 220.

The power supply module 300 may be arranged outside the back board, the main board, or the case. The position of the power supply assembly 300 is not limited.

For example, referring to FIG. 2a, the power supply interface of the hard disk slot may be reused without redefining the slot power supply interface, so that manual operation can be spared.

Figure 5:
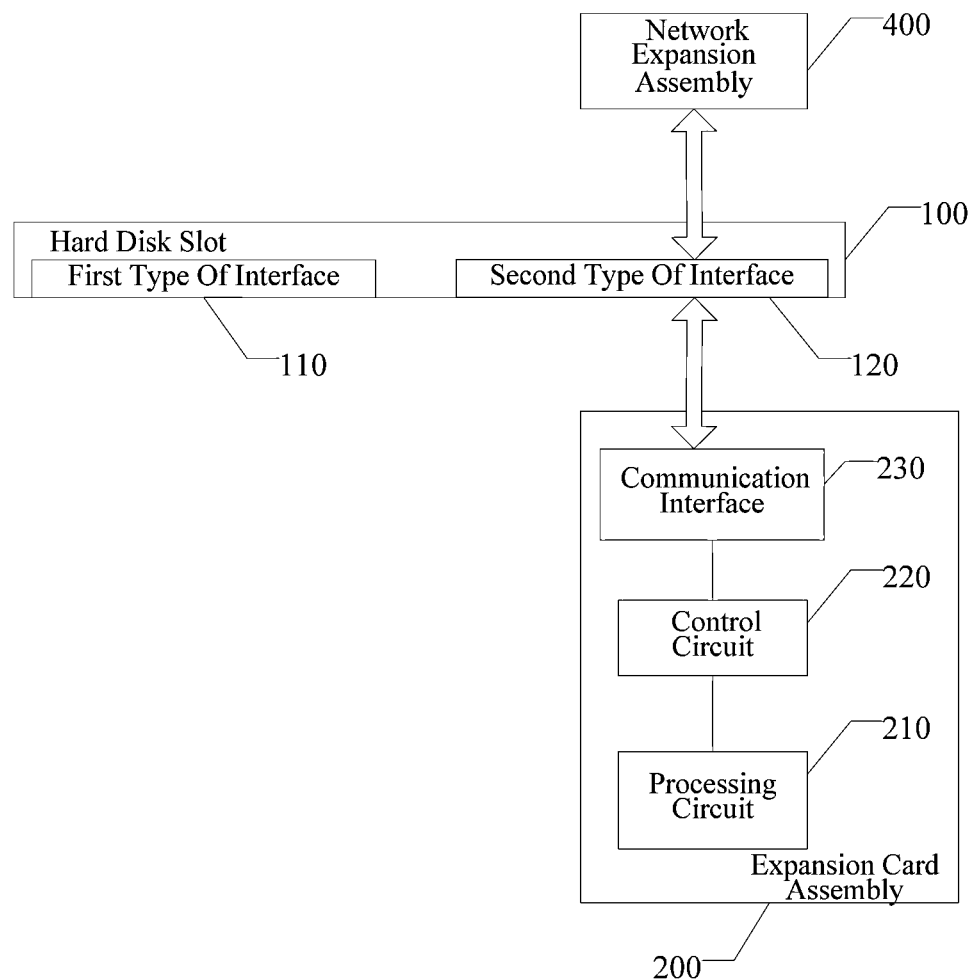
FIG. 5 is a third structural schematic diagram of an electronic device according to an embodiment of the present application.

As an embodiment, referring to FIG. 5, the device further includes a network expansion assembly 400. The network expansion assembly 400 communicates with the communication interface 230 of the expansion card assembly 200 via the second type of interface 120.

For example, the expansion card assembly is a GPU assembly, and the network expansion assembly is connected with an extranet camera via a network port of the extranet. Thus, in the embodiment, the GPU assembly may access video data obtained by the extranet camera and process the video data.

Figure 6:
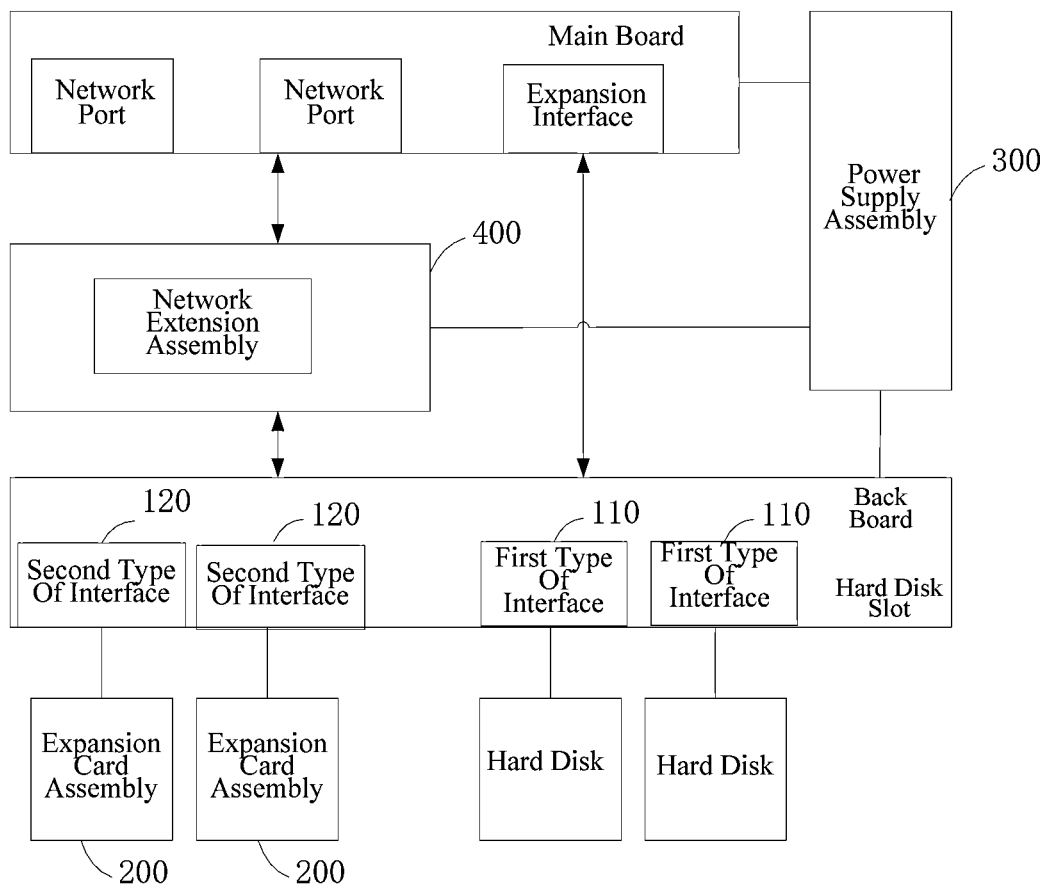
FIG. 6 is a fourth structural schematic diagram of an electronic device according to an embodiment of the present application.

The network expansion assembly 400 may be arranged outside the back board, the main board, or the case. The position of the network expansion assembly 400 is not limited. In a case, referring to FIG. 6, the hard disk slot 100 is arranged on the back board, the network port of the extranet is arranged on the main board, and the network expansion assembly 400 communicates with the network port on the main board. In FIG. 6, each interface in the hard disk slot 100 may also communicate with an expansion interface on the main board.

Figure 7:
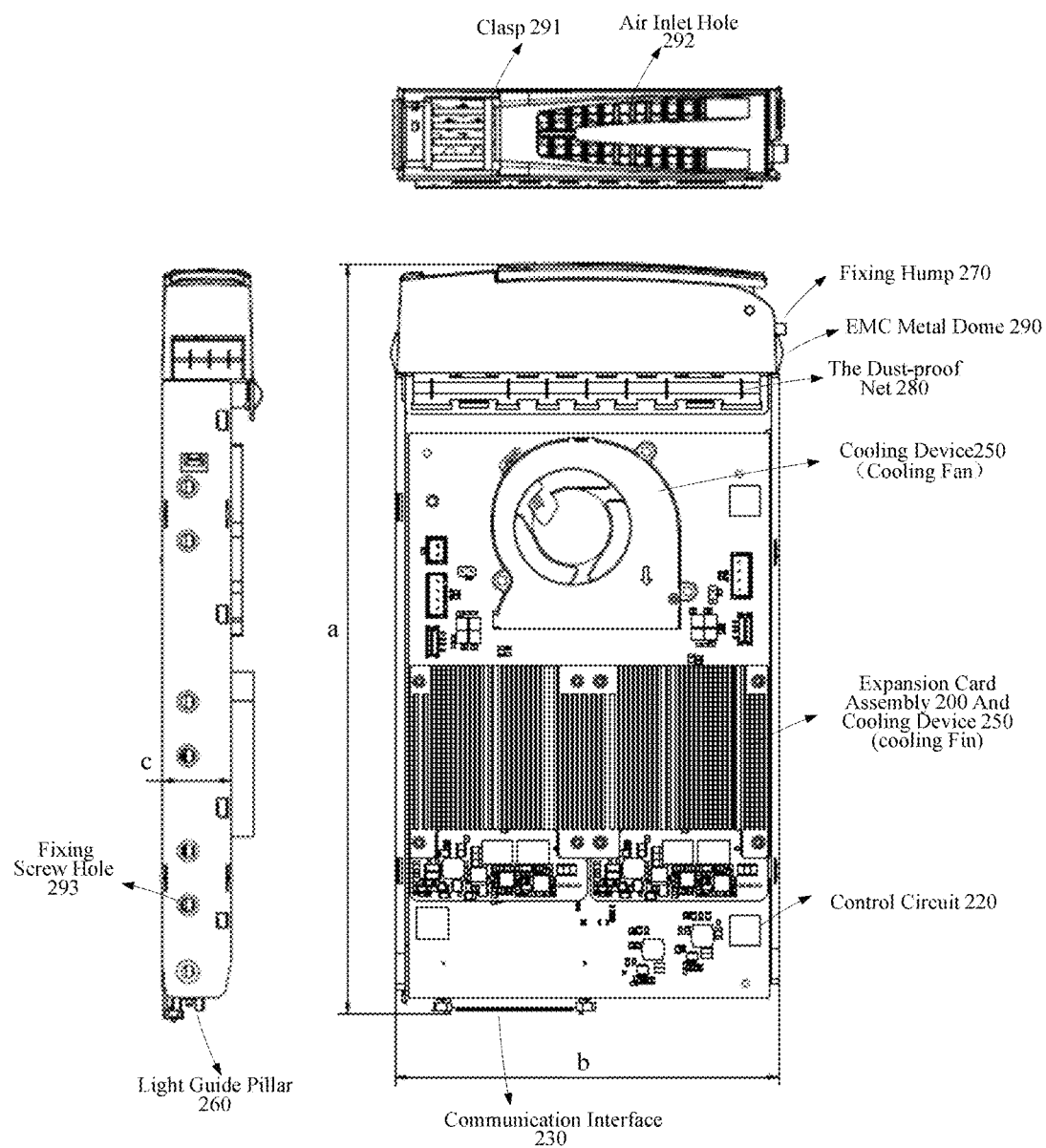
FIG. 7 is a second structural schematic diagram of an expansion card assembly according to an embodiment of the present application.

As an embodiment, the expansion card assembly 200 further includes a cooling device 250. FIG. 7 shows a structural schematic diagram of an expansion card assembly. As shown in FIG. 7, the cooling device 250 includes a cooling fan and a cooling fin. The cooling fin may be connected to the processing circuit 210 in the expansion card assembly 200. In other words, the cooling fin is a cooling fin of the processing circuit 210. The cooling fan may be a turbo fan or may be another type of fan.

In a case, the built-in cooling system of the electronic device may be reused for ventilation and heat dissipation for the expansion card assembly. Costs can be saved.

In FIG. 7, the length of the expansion card assembly 200 is a, the width is b, and the thickness is c, the specific values of a, b, and c are not limited. In a case, the specific values of a, b and c may be the same as those of a 3.5-inch hard disk, or a 2.5-inch hard disk, or a hard disk of other sizes.

In one implementation, referring to FIG. 7, the expansion card assembly 200 further includes a light guide 260, and the device further includes an indicator, and the light guide pillar may guide light emitted by the indicator.

In the embodiment, the built-in indicator of the electronic device is reused. The operating state of the expansion card assembly is indicated by the indicator. In comparison with arrangement of an additional indicator, cost can be reduced.

In one implementation, the expansion card assembly 200 is arranged in the hard disk slot 100 via a tray of the hard disk slot 100 in a pluggable manner. Referring to FIG. 7, the expansion card assembly 200 further includes a fixing hump 270, and the tray of the hard disk slot 100 is fixed by the fixing hump 270.

Alternatively, the expansion card assembly 200 may be fixedly connected to the hard disk slot 100, such as by welding or riveting. Alternatively, the expansion card assembly 200 may in soft connection with the hard disk slot 100 via a wire, and the specific connection manner is not limited.

Referring to FIG. 7, the expansion card assembly 200 may further include a dust-proof net 280. In absence of a dust-proof net 280, dust will be sucked in through air inlet holes and adhere to the expansion card assembly. This may affect the stable operation of the expansion card assembly. The arrangement of the dust-proof net 280 can improve the operation stability and the service life of the expansion card assembly.

Referring to FIG. 7, the expansion card assembly 200 may further include an Electro Magnetic Compatibility (EMC) metal dome 290, which may reduce radiation to the external.

Referring to FIG. 7, the expansion card assembly 200 may further include a clasp 291, through which a handle of a bracket of the expansion card assembly 200 may be more conveniently mounted and dismounted.

Referring to FIG. 7, the expansion card assembly 200 may further include air inlet holes 292, fixing screw holes 293, and the like. Side or bottom fixing screw holes of the hard disk may be used as the fixing screw holes 293. The shape of the expansion card assembly is the same as that of a single 3.5-inche hard disk, or a 2.5-inche hard disk, or a hard disk of other size. Side or bottom fixing screw holes of the hard disks may also be reused.

The electronic device may further include other devices, such as a housing, a main board, a back board, and a power supply, which are not limited by the embodiment of the application. The expansion card assembly 200 may further include other devices, which are not limited by the embodiment of the present application.

The electronic device according to the embodiment of the application includes a hard disk slot and an expansion card assembly. The expansion card assembly is arranged in a pluggable manner in the hard disk slot. The hard disk slot includes a first type of interface and a second type of interface. The first type of interface is used for communicating with the hard disk, and the second type of interface is used for communicating with the expansion card assembly. The electronic device is thus expanded with expansion card assembly by means of the hard disk slot. The expansion requirements of the expansion card assembly is met.

In relevant art, the expansion card assembly is expanded by means of PCIE slots. PCIE slots may be compact in the electronic device and thus result in degraded cooling performance of the electronic device. However, in the solution, the cooling performance is improved through a distributed hard disk slot layout, and the cooling performance is further improved by the cooling device.

Detailed description is provided below with reference to an example where the expansion card assembly is a GPU assembly.

Figure 8:
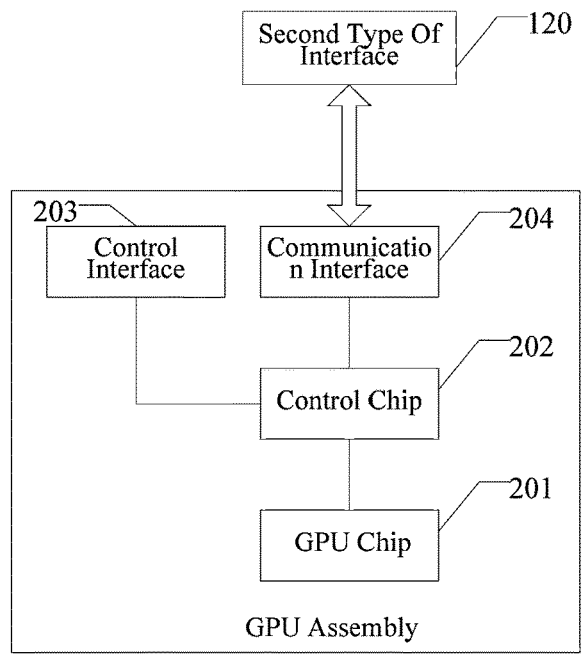
FIG. 8 is a first structural schematic diagram of a GPU assembly according to an embodiment of the present application.

In one implementation, as shown in FIG. 8, the GPU assembly includes a GPU chip 201, a control chip 202, a control interface 203 and a communication interface 204. The GPU chip 201, the control interface 203, and the communication interface 204 are respectively connected to the control chip 202, and the communication interface 204 is connected with the second type of interface 120.

In a case, the first type of interfaces and the second type of interfaces may be completely different interfaces, that is, some interfaces in the hard disk slot may only communicate with the hard disk, and other interfaces may only communicate with the GPU assembly. Alternatively, in another case, the first type of interfaces and the second type of interfaces may be partially same. For example, some interfaces in the hard disk slot may communicate with both the hard disk and the GPU assembly.

A plurality of GPU chips 201 may be included in the GPU assembly. The control chip 202 may be an out-of-band control circuit that controls soft reset and hard reset for the GPU chip 201. The control chip 202 may further monitor the temperature of the GPU chip, and when the temperature is increased, the control chip 202 may control the cooling device to dissipate heat.

In the embodiment, the control chip may include a communication chip connected to the communication interface. Alternatively, the communication chip may be arranged separately. Embodiments are not limited in this aspect. Alternatively, the control chip and GPU chip may be integrated in the same chip. Each component of the electronic device may be arranged separately or integrally as desired. This is not limited in embodiments of the present application. The GPU assembly may further include other components, such as a power supply interface and a power supply circuit.

Continuing with the example wherein the hard disk slot includes the SFF8639 interfaces, the external physical interfaces of the GPU assembly match the SFF8639 interfaces. Referring to FIG. 2b, S26 and S27 in the SFF8639 interfaces may be redefined as out-of-band control interfaces in the GPU assembly, and the redefined interfaces S26, S27 also belong to the second type of interfaces 120. Through the redefined interfaces S26 and S27, the control chip 202 may be controlled to perform operations such as soft reset and hard reset for the GPU chip 201.

Specifically, in FIG. 2b, S26 and S27 are connected to low-speed buses I2C_SCL and I2C_SDA respectively and transmit signaling to the control circuit 220 through the low-speed buses.

Continuing with the example in which the hard disk slot includes the SFF8639 interfaces. Referring to FIG. 2b, S17, S18, S20 and S21 in SFF8639 interfaces may be redefined as interfaces for communicating with the GPU assembly. The redefined interfaces S17, S18, S20, and S21 also belong to the second type of interfaces 120, and the communication interface 204 of the GPU assembly may communicate with the redefined interfaces S17, S18, S20, and S21.

Specifically, in FIG. 2b, C represents a capacitor, and the MDI (Medium Dependent Interface) signal is divided into two groups A and B of differential signals. MDIAP represents a positive pole of MDI signals in group A, and MDIAN represents a negative pole of MDI signals in group A, MDIBP represents a positive pole of MDI signals in group B, and MDIBN represents a negative pole of MDI signals in group B.

Referring to FIG. 2c, E7 to E16 in SFF8639 interfaces may be redefined as GPIO pins for configuring IP/MAC address of the GPU assembly. In FIG. 2c, R represents a resistor. By pulling up and down the 10 GPIOs E7-E16 to different states, the IP/MAC addresses of the GPU chips 201 in the GPU assembly may be independently addressed. Address conflict is thus reduced. For example, the value range of the states of 10 GPIOs may be hexadecimal 0x000 to 0x3ff.

Figure 9:
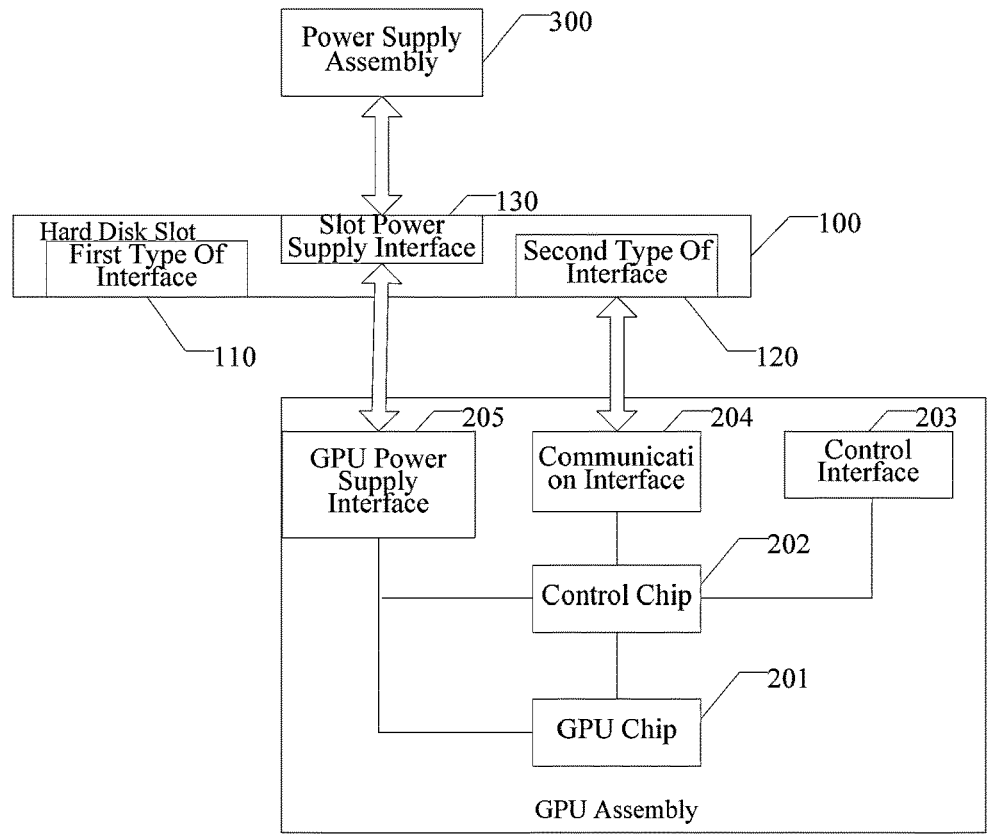
FIG. 9 is a fifth structural schematic diagram of an electronic device according to an embodiment of the present application.

As an embodiment, referring to FIG. 9, the device further incudes a power supply assembly 300, the GPU assembly further includes a GPU power supply interface 205, and the hard disk slot 100 further includes a slot power supply interface 130. The power supply assembly 300 is connected with the slot power supply interface 130, the slot power supply interface 130 is connected with the GPU power supply interface 205, and the GPU power supply interface 205 supplies power to the GPU chip 201 and the control chip 202.

The power supply module 300 may be arranged outside the back board, or the main board, or the case, and the specific position of the power supply module 300 is not limited.

For example, referring to FIG. 2a, in the solution, the power supply interface of the original hard disk slot may be reused, and as described above, the external physical interfaces of the GPU assembly match the SFF8639 interfaces, so that the GPU assembly may use its power supply pins without redefining the slot power supply interface. This can save manual operation.

Figure 10:
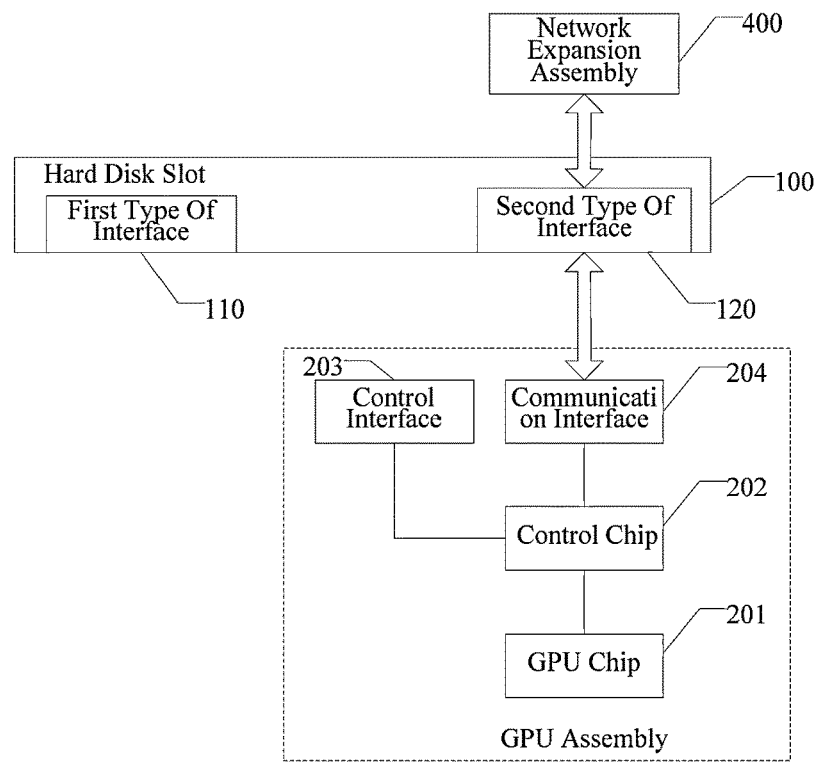
FIG. 10 is a sixth structural schematic diagram of an electronic device according to an embodiment of the present application.

In one implementation, referring to FIG. 10, the device further includes a network expansion assembly 400 that communicates with the communication interface 204 of the GPU assembly through the second type of interface 120.

For example, the network expansion assembly is connected with an extranet camera via a network port of the extranet. Thus, in the embodiment, the GPU assembly may access video data acquired by the extranet camera and process the video data.

Figure 11:
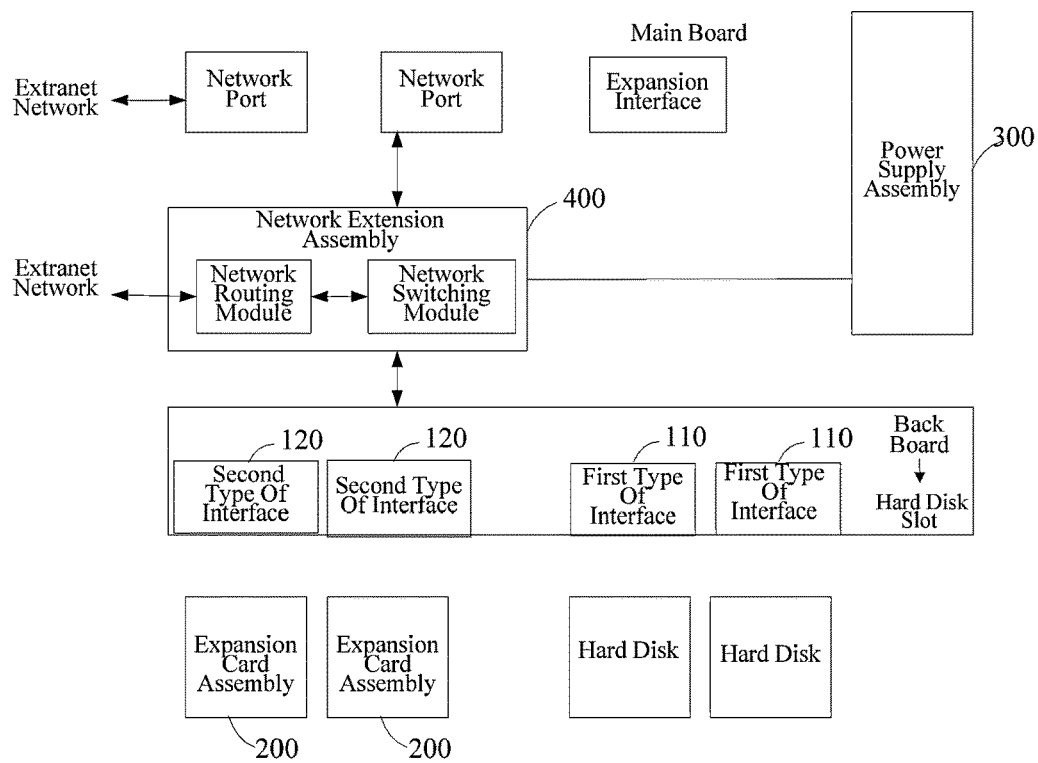
FIG. 11 is a seventh structural schematic diagram of an electronic device according to an embodiment of the present application.

The network expansion assembly 400 may be arranged outside the back board, the main board or the case. The position of the network expansion assembly 400 is not limited. In a case, referring to FIG. 11, the hard disk slot 100 is arranged on the back board, the network port of the extranet is arranged on the main board, and the network expansion assembly 400 communicates with the network port on the main board. In FIG. 11, interfaces in the hard disk slot 100 may also communicate with an expansion interface on the main board.

Still referring to FIG. 11, the network expansion assembly 400 may include a network switch module, a network routing module, an interface conversion module, and other peripheral circuits. The network switch module may implement intranet communication among a plurality of IP nodes, so that the main board may access data in the GPU assembly. The network routing module is used for switch between the intranet and the extranet, so that the GPU assembly may access data in the extranet camera. The intranet may be understood as a network formed by various components inside the electronic device.

Figure 12:
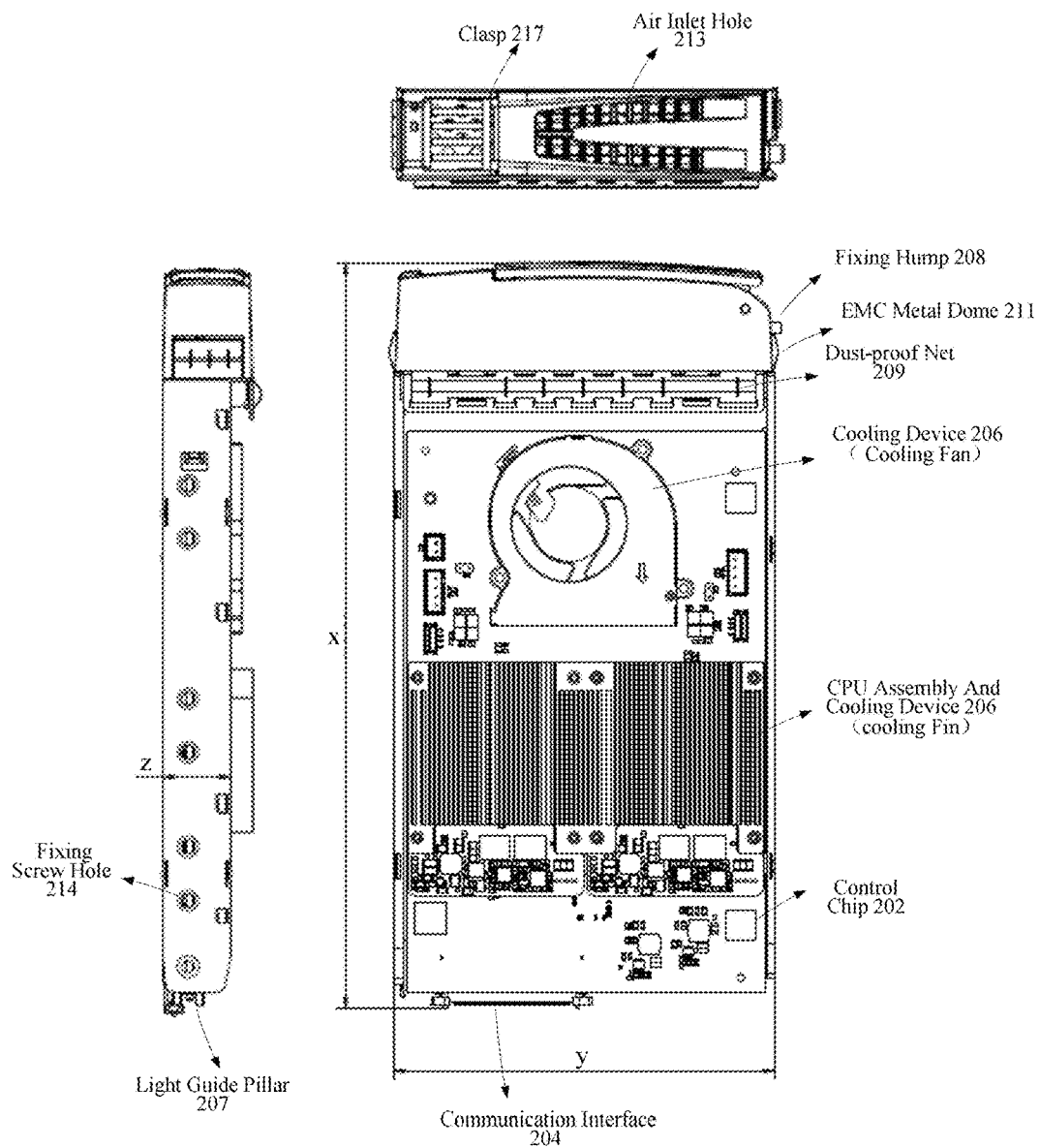
FIG. 12 is a second structural schematic diagram of a GPU assembly according to an embodiment of the present application.

In one implementation, the GPU assembly further includes a cooling device 206. Referring to FIG. 12, which illustrates a structural schematic diagram of a GPU assembly. In FIG. 12, the cooling device 206 includes a cooling fan and a cooling fin. The cooling fin may be connected to the GPU chip 201 in the GPU assembly. Alternatively, the cooling fin is a cooling fin of the GPU chip 201. The cooling fan may be a turbo fan or any other fan.

In a case, the built-in cooling system of the electronic device may be reused for ventilation and heat dissipation for the GPU assembly, so as to save costs.

In FIG. 12, the length of the GPU component is x, the width is y, and the thickness is z. The specific values of x, y, and z are not limited. In a case, the specific values of x, y, and z may be the same as those of a 3.5-inch hard disk, a 2.5-inch hard disk, or a hard disk in other size.

In one implementation, referring to FIG. 12, the GPU assembly 200 further includes a light guide 207, and the device further includes an indicator. The light guide pillar 207 may guide light emitted by the indicator.

In one implementation, the indicator built in the electronic device is reused, and the operating state of the GPU assembly is indicated by the indicator. This saves cost in comparison with providing an additional indicator.

In one implementation, the GPU assembly is arranged in the hard disk slot 100 in a pluggable manner via a tray of the hard disk slot 100. Referring to FIG. 12, the GPU assembly further includes a fixing hump 208, and the tray of the hard disk slot 100 is fixed by the fixing hump 208.

Alternatively, the GPU assembly may be fixedly connected with the hard disk slot 100, such as by welding or riveting. Alternatively, the GPU assembly may be connected to the hard disk slot 100 in a soft manner via a wire. The specific connection manner is not limited.

Referring to FIG. 12, the GPU assembly may further include a dust-proof net 209. Without a dust-proof net 209, dust will be drawn in through air inlet holes and adhere to the expansion card assembly. This may affect the stable operation of the expansion card assembly. The arrangement of the dust-proof net 209 can improve the operation stability and the service life of the expansion card assembly.

Referring to FIG. 12, the GPU assembly may further include an Electro Magnetic Compatibility (EMC) metal dome 211. The EMC metal dome 211 may reduce radiation to the external.

Referring to FIG. 12, the GPU assembly may further include a clasp 212, through which a handle of a bracket of the GPU assembly may be more conveniently mounted and dismounted.

Referring to FIG. 12, the GPU assembly may further include air inlet holes 213, fixing screw holes 214, and the like. Side or bottom fixing screw holes of the hard disk may be reused as fixing screw holes 214. The shape of the GPU assembly is the same as that of an original 3.5-inch hard disk, or an original 2.5-inch hard disk, or a hard disk in other size, and the side and bottom fixing screw holes of these hard disks may be reused.

The GPU assembly may further include other devices, which are not limited by the embodiment of the present application.

The electronic device according to the embodiment of the application includes a hard disk slot and a GPU assembly; wherein the GPU assembly is arranged in the hard disk slot in a pluggable manner; the hard disk slot includes a first type of interface and a second type of interface, wherein the first type of interface is used for communicating with a hard disk, and the second type of interface is used for communicating with a GPU assembly. It can be seen that the GPU assembly is expanded by means of the hard disk slot in the electronic device, and which meets the expansion requirements of the expansion requirement of the GPU assembly.

In relevant art, the expansion card assembly is expanded by means of the PCIE slots that are compact in the electronic device, so that the cooling performance of the electronic device is poor. However, in the solution, the cooling performance is improved by distributing hard disk slots, and the cooling performance is further improved by the arrangement of a cooling device.

Figure 13:
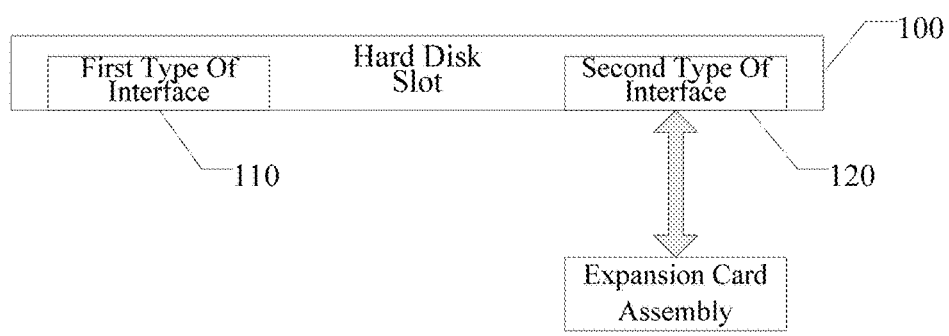
FIG. 13 is an eighth structural schematic diagram of an electronic device according to an embodiment of the present application.

The embodiment of the present application further provides a second type of electronic device which, as shown in FIG. 13, includes a hard disk slot. The hard disk slot supports a pluggable expansion card assembly and includes a first type of interface and a second type of interface. The first type of interface is used for communicating with a hard disk, and the second type of interface is used for communicating with the expansion card assembly.

A dashed box in FIG. 13 indicates that an expansion card assembly may or may not exist in the electronic device.

In a case, the first type of interfaces and the second type of interfaces may be completely different interfaces, that is to say, some interfaces in the hard disk slot may only communicate with the hard disk, and some interfaces may only communicate with the expansion card assembly. Or, in another case, the first type of interfaces and the second type of interfaces may be partially the same, for example, some interfaces in the hard disk slot are able to communicate with both the hard disk and expansion card assembly.

As an embodiment, the device further includes a power supply assembly 300, and the hard disk slot 100 further includes a slot power supply interface 130; wherein, the power supply module 300 is connected with the slot power supply interface 130, and the slot power supply interface 130 is used for supplying power for the expansion card assembly 200.

The power supply module 300 may be arranged outside a back board, a main board, or a case, and the specific position of the power supply module 300 is not limited. For example, referring to FIG. 2a, in the solution, the power supply interface of the original hard disk slot may be reused, and the slot power supply interface does not need to be redefined, which saves manpower.

As an embodiment, the device further includes a network expansion assembly 400, and the network expansion assembly 400 communicates with the communication interface 230 of the expansion card assembly 200 via the second type interface 120.

For example, the expansion card assembly is a GPU assembly, and the network expansion assembly is connected with an extranet camera via a network port of the extranet. Thus, in the embodiment, the GPU assembly may access video data obtained by the extranet camera and process the video data.

The network expansion assembly 400 may be arranged outside a back board, a main board, or a case. The specific position of the network expansion assembly 400 is not limited. In a case, the network expansion module 400 is arranged on the back board, the network port of the extranet is arranged on the main board, and the network expansion assembly 400 communicates with the network port on the main board. The second type of interface 120 in the hard disk slot 100 may further communicate with an expansion interface on the main board, that is, the expansion card assembly 200 may further obtain data on the main board through the second type of interface 120, and the main board may also obtain data in the expansion card assembly 200 through the second type of interface 120.

As an embodiment, the second type of interface is a PCIE interface, and the first type of interface is a SAS interface or a SATA interface.

As an embodiment, the hard disk slot includes an SFF8639 interface.

As an embodiment, the hard disk slot is arranged outside a back board, a main board, or a case.

As an embodiment, the expansion card assembly includes any one or more of the following: a GPU assembly, a CPU assembly, a processor assembly, a network card assembly, a wireless communication assembly and an input/output assembly.

The electronic device may further include other assemblies, such as a housing, a main board, a back board, a power supply, and the like, which are not limited by the embodiment of the present application.

The second electronic device differs from the first electronic device in that the second electronic device does not necessarily include an expansion card assembly. The second electronic device is similar to the first electronic device in the other parts, which are not described repeatedly.

Figure 14A:
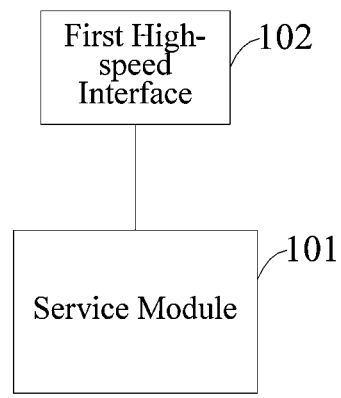
FIG. 14a is a third structural diagram of an expansion card assembly according to an embodiment of the application.

Referring to FIG. 14a, FIG. 14a is a structural diagram of an expansion card assembly according to an embodiment of the present application, including:

a service module 101 and a first high-speed interface 102.
The service module 101 is connected with the first high-speed interface 102.

The service module 101 is configured for performing a specified task. For example, the service module 101 may be an image processor, a CPU assembly, a processor assembly, a network card assembly, a wireless communication assembly, an input/output assembly, or any combination thereof. The image processor may include a Graphics Processing Unit (GPU) chip, etc., and the CPU assembly may include a single chip, an Advanced RISC Machines (ARM) processor, an X86 processor, etc., which are not limited specifically; the processor assembly may include an Accelerated Processing Unit (APU), or a Tensor Processing Unit (TPU), etc., which are not limited specifically; the network card assembly may include a 10M (Megabytes) network card, a 100M network card, a 1000M network card, a 10G (Gigabytes) network card, a 25G network card, a 40G network card, a 100G network card, or a wifi (wireless fidelity) assembly, etc., which are not limited specifically; the wireless communication assembly may include an IoT (Internet of things) wireless assembly, such as an IoT-NODE433 assembly, a Bluetooth assembly, a zigbee assembly, a wifi assembly, etc., which are not limited specifically. The input/output assembly may include an IoT input/output interface board, such as an alarm Input/Output (IO), an RS232 interface board, an RS485 interface board, a Universal Serial Bus (USB) interface board, etc., which are not limited specifically.

The service module 101 may be connected with the first high-speed interface 102 via a cable, a data bus, and a printed wiring on an integrated circuit board. Therefore, corresponding data may be received or sent through the first high-speed interface 102, so that connection with external device, such as a server, a rack server, and the like, is achieved.

The first high-speed interface 102 may be used for transmitting a network signal, wherein the network signal include network signals in the form of RGMII (Reduced Gigabit Media Independent Interface), GMII (Gigabit Media Independent Interface), and the like.

The service module 101 may obtain the network signal through the first high-speed interface 102 and convert them into information or data for data processing. Alternatively, the processed information or data may be converted into a network signal and transmitted through the first high-speed interface 102.

Specifically, the first high-speed interface 102 may include: a Serial Attached Small Computer System Interface (SAS) interface, or a Serial Advanced Technology Attachment (SATA) interface, or a PCIE interface. For example, the first high-speed interface 102 may be a first-generation SAS/SATA interface, a second-generation SAS/SATA interface, and a third-generation SAS/SATA interface. The SAS/SATA interface is a hard disk interface, which may be connected with a SAS/SATA hard disk and is a dedicated interface for the hard disk. In the embodiment of the present application, the expansion card assembly according to the embodiment is connected through the first high-speed interface 102, may be through a hard disk interface on a device such as a server, such as a SAS/SATA interface. Thereby the number of expansion card assemblies that may be connected to a device such as a server is expanded.

In the embodiment of the present application, optionally, the first high-speed interface 102 may be an U.2 interface. The U.2 interface is also referred to an SFF8639 interface, and the interface is an upgraded new SAS/SATA interface, and meanwhile, may also act as a PCIE interface, and supports the transmission of network signals such as RGMII, GMII. The service module 101 according to the embodiment of the present application may be connected to an external device more conveniently, so that high-speed transmission of a network signal is achieved.

Figure 14B:
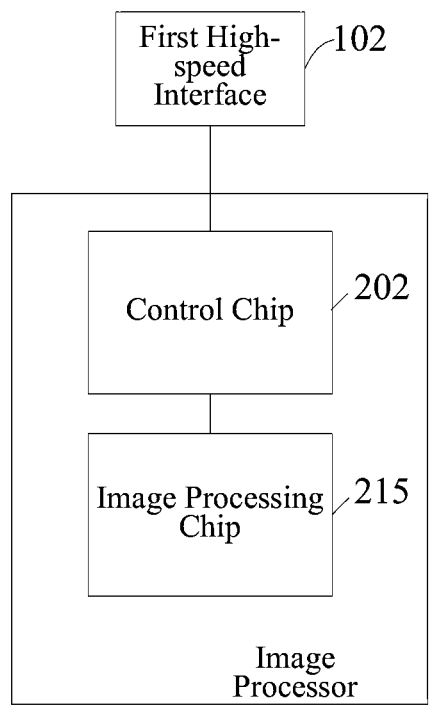
FIG. 14b is a fourth structural diagram of the expansion card assembly according to an embodiment of the present application.

In a possible embodiment, referring to FIG. 14b, the service module 101 may be an image processor.

The image processor may be an assembly or controller with image information/data processing capabilities. For example, it may be an assembly containing a GPU, which may include a GPU chip and a corresponding control circuit and an auxiliary circuit. Image processors may be integrated on one integrated circuit board or may be distributed on multiple integrated circuit boards.

When the embodiment of the present application is applied in practice, the image processor may be in various forms. In an implementation of the embodiment of the present application, the image processor may be an integrated chip or processor and a corresponding supporting circuit. The chip or processor may process image information or data and may implement format conversion on the image information or data, for example, conversion between the image information or data and network signals such as RGMII, GMII. Therefore, the integrated chip or processor may be connected to the first high-speed interface 102 directly and to an external device via the first high-speed interface 102.

In another implementation of the embodiment of the present application, as shown in FIG. 14b, the image processor may include: an image processing chip 215 and a control chip 202.

The image processing chip 215 may be a chip with image information or data processing capabilities, such as a GPU chip. The control chip 202 is a chip capable of converting data types and sending control instructions to the image processing chip 215.

The image processing chip 215 and the control chip 202 may be arranged on a circuit board and connected with each other by a printed wiring on the integrated circuit board. A corresponding auxiliary circuit and a supporting circuit, as well as a corresponding electronic assembly, may further be integrated on the integrated circuit board.

The control chip 202 may be connected with the first high-speed interface 102 through a data bus or a cable. Alternatively, for improved integration, the first high-speed interface 102 may be arranged on the integrated circuit board. For example, the first high-speed interface 102 is a plug-in structure such as a pin or a gold finger of an U.2 interface, and the first high-speed interface 102 may be directly arranged on the integrated circuit board and connected with the control chip 202 through a circuit on the integrated circuit board.

The control chip 202 may convert the network signal into data information that the image processing chip 215 can recognize. The data information may include image information or data that the image processing chip 215 needs to process, and control instructions capable of controlling the image processing chip 215. For example, the control instruction may be a modulation command, a reset command, and the like. The conversion of data types may be completed by the control chip 202, and the image processing chip 215 may be controlled, so that the image processing chip 215 may perform corresponding processing on image information or data according to a preset processing program.

In the embodiment of the present application, the first high-speed interface is a SAS interface, a SATA interface, or a PCIE interface capable of transmitting a network signal, so that the expansion card assembly according to the embodiment of the present application may be connected to the hard disk interface of a device such as a server through the first high-speed interface, for example, the SAS interface, the SATA interface, or the U.2 interface on a main board of the server. Data or information in the form of a network signal may be obtained via the first high-speed interface and then may be processed accordingly through the service module. Not only through PCIE interfaces expansion card assemblies are connected, but also through the first high-speed interface, more expansion card assemblies may be connected to a device such as a server and the like, and the number of the expansion card assemblies that can be connected to the device such as the server and the like is expanded.

In actual applications, a device such as a server is expected to connect as many expansion card assemblies as possible. Therefore, an embodiment of the present application further provides a server device. The server device may be a server in the form of a computer host or a rack-mounted server, etc.

Figure 15:
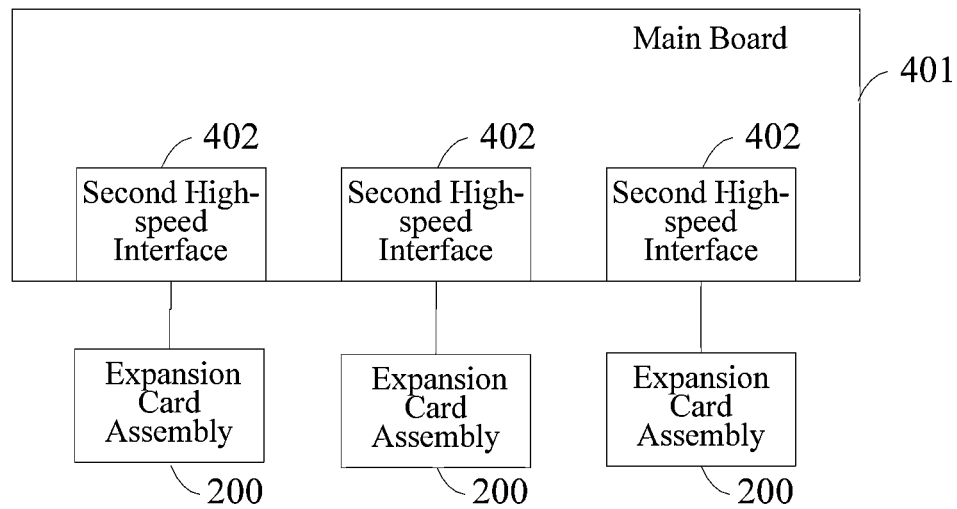
FIG. 15 is a structural diagram of a server device according to an embodiment of the present application.

Referring to FIG. 15, FIG. 15 is a structural diagram of a server device according to an embodiment of the present application, including: a main board 401 having a second high-speed interface 402 arranged thereon. The second high-speed interface 402 includes: a SAS interface or a SATA interface or a PCIE interface.

The main board 401 is connected with the first high-speed interface 102 of the expansion card assembly 200 through the second high-speed interface 402. The expansion card assembly 200 is the expansion card assembly described in any one of the embodiments.

The main board 401 may be in the form of an integrated circuit board, and a processor, such as a CPU (Central Processing Unit), an FPGA (Field-Programmable Gate Array), an MCU (Micro Controller Unit), or the like, may be arranged on the main board 401. A memory, a north-south bridge chip, an external interface such as a network port, a USB interface, an audio and video interface, and a corresponding supporting circuit and an auxiliary component and the like may be arranged thereon.

The main board 401 may have a plurality of second high-speed interfaces 402 of the same type as the first high-speed interfaces 102 on the expansion card assembly 200, and may also be SAS interfaces or SATA interfaces, or PCIE interfaces. In addition, the second high-speed interface 402 on the main board 401 matches the first high-speed interface 102 on the expansion card assembly 200. For example, if the second high-speed interface 402 is an interface slot, the first high-speed interface 102 on the expansion card assembly 200 is a corresponding plug or pin or gold finger. The second high-speed interface 402 of the main board 401 may be connected with the first high-speed interface 102 of the expansion card assembly 200, for example, the expansion card assembly 200 may be plugged into the second high-speed interface 402 of the main board 401 directly.

In order to enable the main board 401 to better connect with the expansion card assembly 200 and to enable the second high-speed interface 402 to realize the reusing of the hard disk, that is, the second high-speed interface 402 may not only be connected with the expansion card assembly 200, but also be connected with the hard disk through the second high-speed interface 402 after the expansion card assembly 200 is removed. Optionally, the high-speed interface may be an U.2 interface.

A PCIE channel and a SAS/SATA interface are integrated in the U.2 interface, so that data transmission between the expansion card assembly 200 and the main board 401 can be implemented, and data transmission between the hard disk and the main board 401 may also be implemented. A plurality of U.2 interfaces may be arranged on the main board 401. Therefore, a plurality of expansion card assemblies 200 and a plurality of hard disks may be connected at the same time.

In a possible embodiment, the second high-speed interface 402 includes the first type of interface 110 and the second type of interface 120, and the first type of interface 110 is used for connecting a hard disk, and the second type of interface 120 is used for connecting the expansion card assembly 200.

In the server device according to the embodiment of the present application, the second high-speed interface 402 is arranged on the main board 401, and a plurality of expansion card assemblies 200 are connected via the second high-speed interface 402, so that the server device according to the embodiment of the present application may not only be connected with the image processing unit such as a graphics card through a conventional PCIE interface, but also be connected with the plurality of expansion card assemblies 200 having image data or information processing capability through the high-speed interface 403. Therefore, the image processing capacity of the server device is improved, and the problem that the PCIE interfaces in the existing various server devices are few is solved, and the number of expansion card assemblies 200 which can be connected with the server device is expanded by reusing the second high-speed interfaces 402 which can be connected with the hard disk.

In practical applications, a large number of second high-speed interfaces 402 cannot be arranged on the main board 401 due to the structural limitations of the main board 401 in many cases, for example, if the server device according to the embodiment of the present application is a rack server. Therefore, for further expanding the number of second high-speed interfaces 402, referring to FIG. 16, the server device according to the embodiment of the present application may further include: a back board 404, on which a second high-speed interface 402 is arranged.

The back board 404 is connected with the expansion card assembly 200 through the second high-speed interface 402.

The back board 404 may be in the form of an integrated circuit board and may be connected with the main board in a variety of ways, such as a data bus, a cable, and the like.

Figure 16:
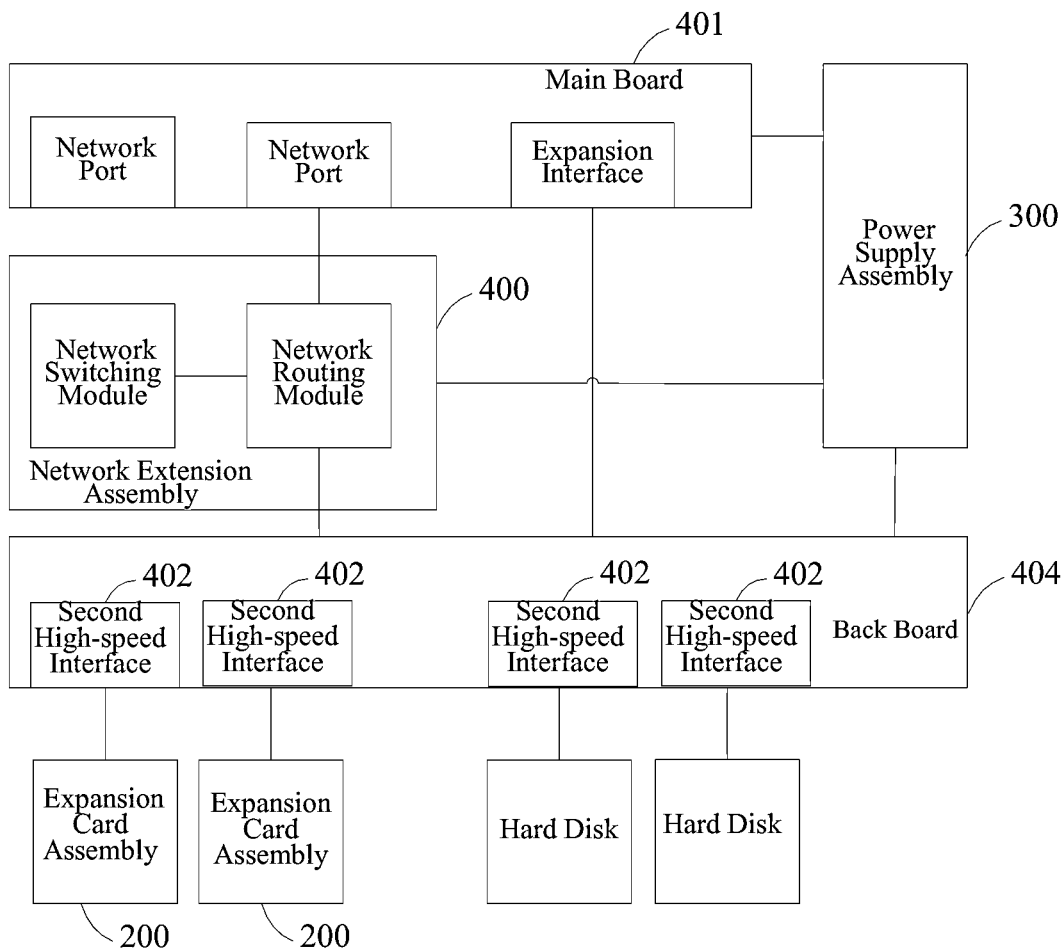
FIG. 16 is a further structural diagram of a server device according to an embodiment of the present application.

A plurality of second high-speed interfaces 402, e.g., a plurality of U.2 interfaces, may be arranged on the back board 404. As shown in FIG. 16, not only a plurality of expansion card assemblies 200 but also a plurality of hard disks may be connected through the second high-speed interface 402. A plurality of expansion card assemblies 200 may be connected in a centralized manner through the back board 402, so that centralized management of the expansion card assemblies 200 may be realized. If the server device according to the embodiment of the application is a rack server, the original rack server may be upgraded and the number of expansion card assemblies 200 that can be connected may be expanded by only replacing the original rack server-type backplane 403 without replacing the original hardware devices on a large scale. The hardware cost is reduced thereby, and the large-scale replacement of hardware devices is avoided.

The shape and structure of the expansion card assembly 200 may be the same as a 3.5-inch hard disk or a 2.5-inch hard disk and may be inserted into a slot of a server device case. The expansion card assembly 200 may be installed by using the tray of the hard disk slot. The hard disk status indicator and the tray light guide pillar on the back board 404 are reused as the status indicator of the expansion card assembly 200.

In order to realize a more convenient and faster connection between the back board 404 and the main board 402, an expansion interface may be arranged on the main board 401. The main board 401 is connected to the back board through the expansion interface. The expansion interface includes: an SAS interface or an SATA interface.

The expansion interface may be a SAS interface or a SATA interface, and correspondingly, a corresponding SAS interface or SATA interface is also arranged on the back board 404, so that the back board 404 can be connected to the expansion interface on the main board 401 through the SAS interface or SATA interface. The SAS interface or SATA interface is a high-speed data transmission interface, so that the high-speed data transmission between the expansion card assembly 200 or the hard disk connected on the back board 404 and the main board 401 is enabled.

Still referring to FIG. 16, in order to enable the server device according to the embodiment of the present application to implement data interaction with the external, the server device according to the embodiment of the present application may further include a network expansion assembly 400, which includes: a network switch module and a network routing module.

The network switch module may implement communication of an intranet network among a plurality of network nodes, wherein the intranet network refers to a network formed among hardware elements in the server device according to the embodiment of the present application. In the server device according to the embodiment of the present application, the main board 401 or the back board 404 transmits network signals, such as RGMII and GMII, from/to the expansion card assemblies 200 through the second high-speed interface 402, such as the U.2 interface, so that the main board 401 or the back board 404 and connected expansion card assemblies 200 may form an intranet.

The network switch module is connected to the back board 404 and the main board 401, respectively. Therefore, the main board 401 is enabled to access connected expansion card assemblies 200 conveniently through the network switch module. For example, a control instruction may be sent to the expansion card assembly 200 to control the expansion card assembly 200. Specifically, the network switch module may include a network switch chip and a corresponding support circuit, so as to implement the transmission of network signals.

The network switch module is connected with the network routing module. The network routing module may include a network chip or controller with routing function and corresponding supporting circuit. The network routing module and the network routing module may be integrated on a single integrated circuit board and are connected to each other by the printed wiring on the integrated circuit board. Thereby, an integrated network expansion assembly 400 may be formed. Of course, the network switch module and the network routing module may also be standalone hardware assemblies, such as two integrated circuit boards, and may be connected to each other through a data bus, a cable, and the like. The network routing module may be connected to devices that can implement network connection through network cables such as switches, servers, IP cameras, and computers.

The network routing module may be connected to the extranet, which may include a local area network or the internet, through a network cable or a wireless network. The connection between the intranet and the extranet can be realized through the network routing module. Therefore, the main board 401 in the server device and the expansion card assembly 200 according to the embodiment of the present application can access network nodes in the extranet, and obtain obtained data or information from network nodes.

For example, in an actual application scenario, the server device according to the embodiment of the present application is a rack server in a monitoring system, which is configured for performing image processing on a video image obtained by an JPC (TIP Camera). Through the network routing module, the expansion card assembly 200 connected through the second high-speed interface 402 in the rack server may directly access the IPC and obtain corresponding video data or information to be processed from the IPC. Specifically, the video data or information in the IPC may be finally transmitted to the expansion card assembly 200 through the transmission of the network routing module, the network switch module, and the back board 404. In the embodiment of the present application, through the network expansion assembly 400, not only network communication among hardware components inside the server device according to the embodiment of the present application can be implemented, but also data interaction between the server device and the extranet can be implemented, so that the application range of the server device according to the embodiment of the present application is expanded.

In combination with the foregoing embodiments, optionally, in the server device according to an embodiment of the present application further includes a power supply assembly 300 which is connected with the network expansion assembly 400, the main board 401, and the back board 404, respectively.

The power supply assembly 300 may be a built-in power supply, such as a device like a battery, or may be a voltage conversion device capable of being connected to an external power supply. For example, the power supply assembly 300 may be a host power supply capable of converting a conventional voltage 220V to operating voltages required by hardware devices. The power supply assembly 300 may further include a UPS (Uninterruptible Power System/Uninterruptible Power Supply) and the like. Therefore stable operation of the server device according to the embodiment of the present application can be ensured.

The power supply assembly 300 may be connected with the network expansion module 400, the main board 401, and the back board 404 through lines such as cables, thereby the power supply assembly can supply operating power to these hardware components. For example, the power supply assembly 300 is connected with the back board 404 so that the power supply pins on each second high-speed interface 402 on the back board 404 can have an operating voltage. For example, the U.2 interface can have a corresponding operating voltage on each of the power supply pins. Therefore, the operating power can be supplied to the expansion card assembly 200 or the hard disk through the power supply pin in the second high-speed interface 402, when the expansion card assembly 200 or the hard disk is connected on the second high-speed interface 402. In the embodiment of the present application, the power supply assembly 300 can supply stable operating power to the server device according to the embodiment of the present application. And each expansion card assembly 200 can obtain stable operating power supply through the second high-speed interface 402 without connecting an additional power supply.

Figure 17:
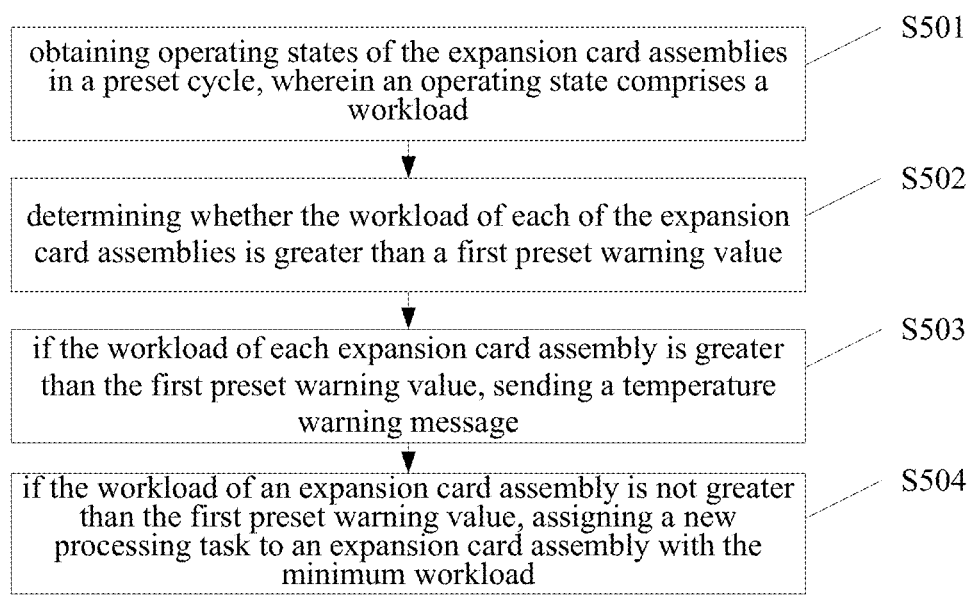
FIG. 17 is a flowchart of a method for managing a server device according to an embodiment of the present application.

Referring to FIG. 17, FIG. 17 is a method for managing an expansion card assembly according to an embodiment of the application, which can be applied to the server device described in any one of the foregoing embodiments, and the server device is connected with a plurality of expansion card assemblies through high-speed interfaces. The method includes the following steps:

In Step S501, operating states of expansion card assemblies are obtained according to a preset cycle and the operating state includes workload.

A processor on the main board of the server device according to the embodiment of the present application can obtain an operating state of each expansion card assembly according to a preset cycle, so as to manage and control each expansion card assembly according to the operating state thereof. In one possible embodiment, the expansion card assembly may be an image processing apparatus specifically.

The preset cycle may be set according to a requirement, and may be, for example, 5 minutes, 10 minutes, or the like.

The operating state refers to various running parameters of the expansion card assembly during operation. For example, the operating state may include the current workload, an operating temperature, runtime, and on the like. The workload refers to the amount of the tasks processed by the expansion card assembly, and may be generally characterized by a parameter such as processor occupancy.

In Step S502, a determination is made as to whether the workload of each of the expansion card assemblies is greater than a first preset warning value.

After an operating state of each expansion card assembly is obtained, a determination can be made as to whether the workload of each expansion card assembly is greater than a first preset warning value.

Moreover, in order to assign newly generated processing tasks more properly, whether workload of each expansion card assembly is greater than the first preset alert value is determined upon a new processing task appears, so as to balance loads among expansion card assemblies.

The first preset warning value may be set according to a requirement, for example, if the workload is indicated by the processor occupancy, the first preset warning value may be 100%, that is, a determination is made as to whether the workload of each expansion card assembly reaches 100%.

In Step S503, if the workload of each expansion card assembly is greater than the first preset warning value, then a temperature warning message is sent.

If workload of each expansion card assembly is greater than the first preset warning value, it is indicated that all the expansion card assemblies are in a full-load operating state. At this time, if a new task is generated, the new task cannot be processed in time. Therefore, a warning message may be sent. The user can know in time that all the expansion card assemblies are currently in a full-load operating state through the warning message. Therefore, the user may decide whether to increase the number of expansion card assemblies connected in the server device according to this situation.

Moreover, when a new processing task occurs, the newly generated processing task cannot be assigned since all the expansion card assemblies are currently in a full-load operating state. The warning message meanwhile may indicate that the processing task fails to be processed and needs to be retried later or after an expansion card assembly is added.

Specifically, the processor in the main board may obtain the operating state of each expansion card assembly according to a preset program, and compare the operating state with the first preset warning value set in advance, and then determine whether the workload of each expansion card assembly is greater than the first preset warning value. A temperature warning message is sent via the network expansion assembly or via, for example, an indicator or via a connected display or the like, so that relevant person can take corresponding measures to process in time.

In step S504, if the workload of an expansion card assembly is not all greater than the first preset warning value, a new processing task is assigned to an expansion card assembly with the minimum workload.

If there is workload of an expansion card assembly that does not reach the first preset warning value, it means that the expansion card assemblies connected with the server device has certain processing capacity and may process the processing task, so that a newly generated processing task and the like may be assigned to an expansion card assembly with the minimum workload so that the load among expansion card assemblies is more balanced.

Further, the server device may further set a plurality of first preset alert values of different levels for the workload of expansion card assemblies, for example, the first preset alert values may include a plurality of levels such as 100%, 70%, 50%. When the workloads of expansion card assemblies all exceeds any one of the first preset warning values of the multiple levels above-mentioned, the server device may send a corresponding warning message of a different level. For example, when the workloads of the expansion card assemblies all exceed 70%, the warning message sent may be a prompt to related personnel that currently the workload of expansion card assemblies are relatively high, and the related personnel may be advised to increase the number of the expansion card assemblies.

In the embodiment of the present application, an image processing task can be more reasonably assigned among the plurality of expansion card assemblies by monitoring the operating state of each expansion card assembly, so that the loads among expansion card assemblies are more balanced. Moreover, when the workloads are high, related personnel can be timely reminded to increase the number of the expansion card assemblies through the warning message.

In combination with the embodiment, in order to further improve the reliability of the operation of each expansion card assembly, in the embodiment of the present application, the obtained operating state of each expansion card assembly may include: an operating temperature. The operating temperature is the actual temperature of each expansion card assembly during operation.

Correspondingly, in step S501, after the step of obtaining the operating state of each expansion card assembly according to the preset period, the method further includes the followings.

In a first step, a determination is made as to whether the operating temperature of any expansion card assembly is higher than a second preset warning value.

After operating temperature of each expansion card assembly is obtained, it is determined whether one or more operating temperature of one or more expansion card assemblies are higher than the second preset warning value. The second preset warning value may be set according to a requirement, for example, the second preset warning value may be 80° C., 90° C., and so on.

In a second step, if any expansion card assembly has an operating temperature higher than the second preset warning value, then rotating speed of a cooling fan is increased.

If the one or more operating temperature of one or more expansion card assemblies are higher than the second preset warning value, it means that currently, one or more specific expansion cards are not sufficiently heat dissipated, so that the rotating speed of the cooling fan may be increased to accelerate the cooling of the expansion card assemblies. The cooling fan may be a cooling fan in the case of a server device, a plurality of rotating speed gears may be arranged for the rotating speed of the cooling fan, and a rotating speed gear may be increased or decreased according to different actual requirements. Therefore, the power consumption may be reduced as much as possible on the premise of satisfying the requirement of cooling. Specifically, a correspondence table between the rotation speed and the operating temperature may be preset in the server device, and the corresponding rotation speed may be correspondingly adjusted according to an actual operating temperature.

In a third step, if the rotating speed of the cooling fan is at a maximum rotating speed and the operating temperature of the expansion card assembly is higher than the second preset warning value, then a temperature warning message is sent.

If the rotating speed of the cooling fan has been adjusted to the highest gear, that is, the rotating speed of each cooling fan is at the maximum rotating speed. Meanwhile, if an expansion card assembly with operating temperature higher than the second preset warning value still exists, it indicates that the cooling capability of the current server device can no longer meet the needs of the expansion card assemblies. Therefore, temperature warning message may be sent to related personnel to prompt them that the temperature of the current expansion card assembly is too high. Specifically, the temperature warning message may also be implemented in various ways, such as a network, a display, and an indicator. Moreover, an identifier, such as a serial number or a name, of the expansion card assembly with temperature exceeding the second preset warning value may be included in the temperature warning message.

In combination with the foregoing embodiments, optionally, in the embodiment of the present application, in order to ensure the power supply of each expansion card assembly, the total power of a plurality of expansion card assemblies does not exceed the total power of the power supply assemblies in the server device. In actual application, when the server device is started, the expansion card assembly is powered on one by one.

When the server device is started, expansion card assembly connected to each second high-speed interface is not directly turned on, instead power supply pins of the high-speed interfaces turned one by one, so that the expansion card assembly is powered on and started one by one. In the process, the output power of the power supply assembly is gradually increased, and there are too many expansion card assemblies, and total power thereof exceeds the total power of the power supply assembly, it can be found in time and the subsequent expansion card assembly may be stopped from being started. The stability of the server device is ensured, and the impact on the power supply assembly caused by the simultaneous starting is avoided.

In combination with the above embodiment, in actual application, a situation that the operating state of the expansion card assembly cannot be normally obtained may occur when the server device obtains the operating state of the expansion card assembly, for example, an inquiry instruction is sent out to the expansion card assembly, and the expansion card assembly does not reply correspondingly.

If the operating state of the expansion card assembly cannot be obtained, it indicates that abnormality may occur to the expansion card assembly, such as a crash, stuck in an infinite program loop, and the like. Therefore, the expansion card assembly may be restarted and which makes the expansion card assembly to restores to normal operation. In the embodiment of the present application, by obtaining the operating state of each expansion card assembly according to the preset period can, not only the operation status of each expansion card assembly is gotten in time, but also the expansion card assemblies that are operating or running abnormally are identified in time, and such expansion card assemblies are automatically restarted, so that the running reliability and stability of the server device is further ensured.

The above description is only a preferred embodiment of the present application and are not intended to limit this application, and any modifications, equivalents, improvements and the like made within the spirit and principle of the present application should be included in the protection scope of the present application.

What is claimed is:

1. An electronic device, comprising: a hard disk slot that supports a pluggable expansion card assembly and comprises a first type of interface for communicating with a hard disk and a second type of interface for communicating with the expansion card assembly, wherein the second type of interface is a PCIE interface, and the first type of interface is a SAS interface or a SATA interface, wherein the electronic device further comprises an indicator; and the expansion card assembly further comprises a light guide that guides light emitted by the indicator.

2. The electronic device of claim 1, further comprising an expansion card assembly arranged in the hard disk slot in a pluggable way.

3. The electronic device of claim 2, wherein, the expansion card assembly comprises a processing circuit, a control circuit, and a communication interface; wherein the processing circuit and the communication interface are respectively connected with the control circuit, and the communication interface is connected with the second type of interface.

4. The electronic device of claim 3, further comprising a power supply assembly; the expansion card assembly further comprises an expansion card power supply interface, and the hard disk slot further comprises a slot power supply interface; wherein, the power supply assembly is connected with the slot power supply interface, the slot power supply interface is connected with the expansion card power supply interface, and the expansion card power supply interface supplies power for the processing circuit and the control circuit.

5. The electronic device of claim 2, wherein the expansion card assembly further comprises a cooling device.

6. The electronic device of claim 2, wherein the pluggable expansion card assembly is arranged in the hard disk slot in a pluggable manner via a tray of the hard disk slot; and the expansion card assembly further comprises a fixing hump through which the tray of the hard disk slot is fixed.

7. The electronic device of claim 1, further comprising a network expansion assembly for communicating with a communication interface of the expansion card assembly via the second type of interface.

8. The electronic device of claim 1, wherein the hard disk slot comprises an SFF8639 interface, and/or
the hard disk slot is arranged outside a back board, a main board, or a case.

9. The electronic device of claim 1, wherein the expansion card assembly comprises one or more of: a GPU assembly, a CPU assembly, a processor assembly, a network card assembly, a wireless communication assembly and an input/output assembly.

10. The electronic device of claim 9, wherein the GPU assembly comprises a GPU chip, a control chip, a control interface, and a communication interface; wherein the GPU chip, the control interface and the communication interface are respectively connected with the control chip, and the communication interface is connected with the second type of interface; and
the GPU assembly further comprises: a cooling fan; and/or a cooling fin connected to the GPU chip.

11. An expansion card assembly, comprising:
a service module and a first high-speed interface;
the service module is connected with the first high-speed interface;
the first high-speed interface comprises: a serial attached interface (SAS) or a serial advanced technology attachment (SATA) interface or a high-speed serial computer expansion bus PCIE interface, wherein the expansion card assembly is connected to the second type of interface of the electronic device of claim 1 through the first high-speed interface; and
the first high-speed interface is used for transmitting network signals, the network signals comprising reduced gigabit media independent interface (RGMII) signals and gigabit media independent interface (GMII) signals.

12. The expansion card assembly of claim 11, wherein the service module comprises at least one of: an image processor, a CPU assembly, a processor assembly, a network card assembly, a wireless communication assembly and an input/output assembly.

13. The expansion card assembly of claim 12, wherein the service module comprises an image processor, which comprises an image processing chip and a control chip;
the control chip is connected with the image processing chip and the first high-speed interface; and
the control chip converts the network signals into data information that can be recognized by the image processing chip; and/or
the first high-speed interface is an U.2 interface.

14. A server device, comprising a main board having a second high-speed interface arranged thereon which comprises: a SAS interface, a SATA interface or a PCIE interface;
the main board is connected, via the second high-speed interface, with a first high-speed interface of an expansion card assembly according to claim 11.

15. The server device of claim 14, wherein the second high-speed interface is an U.2 interface; and/or
the device further comprises a back board, on which the second high-speed interface is arranged;
the back board is connected with the expansion card assembly via the second high-speed interface; and
the main board has an expansion interface arranged thereon, and is connected with the back board via the expansion interface, and the expansion interface comprises: a SAS interface or a SATA interface.

16. The server device of claim 15, further comprising a network expansion assembly that comprises a network switch module and a network routing module;
the network switch module is connected with the network routing module; and
the network switch module is connected with the back board and the main board.

17. An expansion card assembly management method, applicable to a server device according to claim 15, the server device being connected with a plurality of expansion card assemblies via a second high-speed interface, and the method comprising:
obtaining operating states of the expansion card assemblies in a preset cycle, wherein an operating state comprises a workload;
determining whether the workload of each of the expansion card assemblies is greater than a first preset warning value; and
if the workload of each expansion card assembly is greater than the first preset warning value, sending a temperature warning message; or if the workload of an expansion card assembly is not greater than the first preset warning value, assigning a new processing task to an expansion card assembly with the minimum workload.

18. The method of claim 17, wherein the operating state comprises an operating temperature;
after obtaining operating states of the expansion card assemblies in a preset cycle, the method further comprises:
determining whether an operating temperature of any of the expansion card assemblies is higher than a second preset warning value;
if any of the expansion card assemblies has an operating temperature higher than the second preset warning value, increasing the rotation rate of a cooling fan; and
if the rotation rate is at a maximum rate and an expansion card assembly has an operating temperature higher than the second preset warning value, sending a temperature warning message.

19. The method of claim 17, further comprising:
powering on the expansion card assemblies one after another when the server device is started; and/or
if the operating state of an expansion card assembly cannot be obtained, restarting the expansion card assembly.

* * * * *